United States Patent
Niwa et al.

(10) Patent No.: US 11,769,860 B2
(45) Date of Patent: *Sep. 26, 2023

(54) SEMICONDUCTOR LIGHT-EMITTING ELEMENT AND METHOD OF MANUFACTURING SEMICONDUCTOR LIGHT-EMITTING ELEMENT

(71) Applicant: NIKKISO CO., LTD., Tokyo (JP)

(72) Inventors: Noritaka Niwa, Ishikawa (JP); Tetsuhiko Inazu, Ishikawa (JP)

(73) Assignee: NIKKISO CO., LTD., Tokyo (JP)

( * ) Notice: Subject to any disclaimer, the term of this patent is extended or adjusted under 35 U.S.C. 154(b) by 190 days.

This patent is subject to a terminal disclaimer.

(21) Appl. No.: 17/244,211

(22) Filed: Apr. 29, 2021

(65) Prior Publication Data
US 2021/0359161 A1    Nov. 18, 2021

(30) Foreign Application Priority Data
May 13, 2020 (JP) ................... 2020-084536

(51) Int. Cl.
*H01L 33/32* (2010.01)
*H01L 33/38* (2010.01)
(Continued)

(52) U.S. Cl.
CPC .......... *H01L 33/32* (2013.01); *H01L 33/0075* (2013.01); *H01L 33/14* (2013.01); *H01L 33/382* (2013.01); *H01L 2933/0016* (2013.01)

(58) Field of Classification Search
CPC ......... H01L 33/14; H01L 33/40; H01L 33/32; H01L 33/0075; H01L 33/007; H01L 33/382; H01L 33/38; H01L 2933/0016
See application file for complete search history.

(56) References Cited

U.S. PATENT DOCUMENTS 10,069,045 B2 * 9/2018 Ikegami ................ H01L 33/508
11,387,385 B2 * 7/2022 Niwa ..................... H01L 33/385
(Continued)

FOREIGN PATENT DOCUMENTS

| CN | 105552191 A | 5/2016 |
|----|-------------|--------|
| JP | 2013254893 A | 12/2013 |

(Continued)

OTHER PUBLICATIONS

Office Action of JP Application No. 2020-084536 and English translation, dated Sep. 1, 2020, 4 pages.

*Primary Examiner* — Savitri Mulpuri
(74) *Attorney, Agent, or Firm* — Muncy, Geissler, Olds & Lowe, P.C.

(57) ABSTRACT

The semiconductor light-emitting element has an n-type semiconductor layer; an active layer provided on a first upper surface of the n-type semiconductor layer; a p-type semiconductor layer provided on the active layer; a p-side contact electrode provided in contact with the upper surface of the p-type semiconductor layer; a p-side current diffusion layer provided on the p-side contact electrode in a region narrower than a formation region of the p-side contact electrode; a p-side pad electrode provided on the p-side current diffusion layer; an n-side contact electrode provided in contact with a second upper surface of the n-type semiconductor layer; an n-side current diffusion layer provided on the n-side contact electrode over a region wider than a formation region of the n-side contact electrode, and including a TiN layer; and an n-side pad electrode provided on the n-side current diffusion layer.

5 Claims, 10 Drawing Sheets

(51) Int. Cl.
  *H01L 33/00* (2010.01)
  *H01L 33/14* (2010.01)

(56) References Cited

U.S. PATENT DOCUMENTS

| | | | |
|---|---|---|---|
| 11,387,386 B2 * | 7/2022 | Inazu | H01L 33/40 |
| 11,404,606 B2 * | 8/2022 | Inazu | H01L 33/405 |
| 2013/0330852 A1 * | 12/2013 | Okuyama | H01L 24/06 |
| | | | 438/26 |
| 2017/0069793 A1 * | 3/2017 | Saito | H01L 33/12 |
| 2018/0083164 A1 * | 3/2018 | Takenaka | H01L 33/38 |
| 2021/0135058 A1 * | 5/2021 | Niwa | H01L 33/44 |
| 2021/0193872 A1 * | 6/2021 | Inazu | H01L 33/32 |
| 2022/0320375 A1 * | 10/2022 | Niwa | H01L 33/44 |

FOREIGN PATENT DOCUMENTS

| | | | |
|---|---|---|---|
| JP | 2019192908 A | | 10/2019 |
| JP | 2019207925 A | | 12/2019 |
| TW | 201351519 A | | 12/2013 |

\* cited by examiner

SEMICONDUCTOR LIGHT-EMITTING ELEMENT AND METHOD OF MANUFACTURING SEMICONDUCTOR LIGHT-EMITTING ELEMENT

RELATED APPLICATION

Priority is claimed to Japanese Patent Application No. 2020-084536, filed on May 13, 2020, the entire content of which is incorporated herein by reference.

BACKGROUND OF THE INVENTION

1. Field of the Invention

The present invention relates to a semiconductor light-emitting element and a method of manufacturing a semiconductor light-emitting element.

2. Description of the Related Art

The semiconductor light-emitting element has an n-type semiconductor layer, an active layer, and a p-type semiconductor layer which are stacked on a substrate, wherein the n-type semiconductor layer is provided on an n-side electrode, and the p-type semiconductor layer is provided on a p-side electrode. Some light-emitting elements using a nitride semiconductor such as GaN or AlGaN employ an n-side electrode composed of a stack of Ti and Al (see JP2019-192908A, for example).

With such n-side electrode free of Au, the n-side electrode will have increased ultraviolet reflectance. However, when the n-side electrode is formed using Al, absence of Au in the n-side electrode for protecting the electrode can promote corrosion of Al during energized use, resulting in lowered ultraviolet reflectance.

SUMMARY OF THE INVENTION

The present invention has been made considering these problems, and an object of which is to provide a technique for suppressing light output from declining during energized use of a semiconductor light-emitting element.

The semiconductor light-emitting element according to one aspect of the present invention includes: an n-type semiconductor layer composed of an n-type AlGaN-based semiconductor material; an active layer provided on a first upper surface of the n-type semiconductor layer and composed of an AlGaN-based semiconductor material; a p-type semiconductor layer provided on the active layer; a p-side contact electrode provided in contact with the upper surface of the p-type semiconductor layer; a p-side current diffusion layer provided on the p-side contact electrode in a region narrower than a formation region of the p-side contact electrode; a p-side pad electrode provided on the p-side current diffusion layer; an n-side contact electrode provided in contact with a second upper surface of the n-type semiconductor layer; an n-side current diffusion layer provided on the n-side contact electrode over a region wider than a formation region of the n-side contact electrode, and including a TiN layer; and an n-side pad electrode provided on the n-side current diffusion layer.

According to this aspect, with the p-side current diffusion layer provided on the p-side contact electrode in a region narrower than the formation region of the p-side contact electrode, the p-side contact electrode may have a maximum area occupied on the upper surface of the p-type semiconductor layer, so that the light-emitting layer may have a maximum area contributive to light emission. Moreover, with the n-side current diffusion layer having the TiN layer provided on the n-side contact electrode over a region wider than the formation region of the n-side contact electrode, the n-side contact electrode may be suppressed from being corroded during energized use. This successfully suppresses decrease in reflectance of the n-side contact electrode that functions as a reflective electrode, and suppresses the light output from declining during energized use.

Each of the p-side current diffusion layer and the n-side current diffusion layer may have a stacked structure in which a TiN layer, a metal layer and a TiN layer are stacked in order.

The n-side current diffusion layer may include a first current diffusion layer provided on the n-side contact electrode, and a second current diffusion layer provided on the first current diffusion layer. Each of the first current diffusion layer and the second current diffusion layer may have a stacked structure in which a TiN layer, a metal layer and a TiN layer are stacked in order.

The first current diffusion layer may be provided over a region wider than the formation region of the n-side contact electrode.

The second current diffusion layer may be provided over a region wider than the formation region of the first current diffusion layer.

The metal layer in the stacked structure may be thicker than the TiN layer in the stacked structure.

Another aspect of the present invention relates to a method of manufacturing a semiconductor light-emitting element. The method includes: forming an active layer composed of an AlGaN-based semiconductor material, on an n-type semiconductor layer composed of an n-type AlGaN-based semiconductor material; forming a p-type semiconductor layer on the active layer; partially removing the p-type semiconductor layer and the active layer so that the upper surface of a partial region of the n-type semiconductor layer is exposed; forming a p-side contact electrode in contact with the upper surface of the p-type semiconductor layer; forming a p-side current diffusion layer on the p-side contact electrode in a region narrower than a formation region of the p-side contact electrode; forming an n-side contact electrode in contact with the exposed upper surface of the n-type semiconductor layer; forming an n-side current diffusion layer that includes a TiN layer on the n-side contact electrode, over a region wider than a formation region of the n-side contact electrode; forming a p-side pad electrode on the p-side current diffusion layer; and forming an n-side pad electrode on the n-side current diffusion layer.

According to this aspect, with the p-side current diffusion layer provided on the p-side contact electrode in a region narrower than the formation region of the p-side contact electrode, the p-side contact electrode may have a maximum area occupied on the upper surface of the p-type semiconductor layer, so that the light-emitting layer may have a maximum area contributive to light emission. Moreover, with the n-side current diffusion layer having the TiN layer provided on the n-side contact electrode over a region wider than the formation region of the n-side contact electrode, the n-side contact electrode may be suppressed from being corroded during energized use. This successfully suppresses decrease in reflectance of the n-side contact electrode that functions as a reflective electrode, and suppresses the light output from declining during energized use.

The method may further include annealing the n-side contact electrode. The n-side current diffusion layer may be formed after annealing the n-side contact electrode.

DETAILED DESCRIPTION OF THE INVENTION

Figure 1:
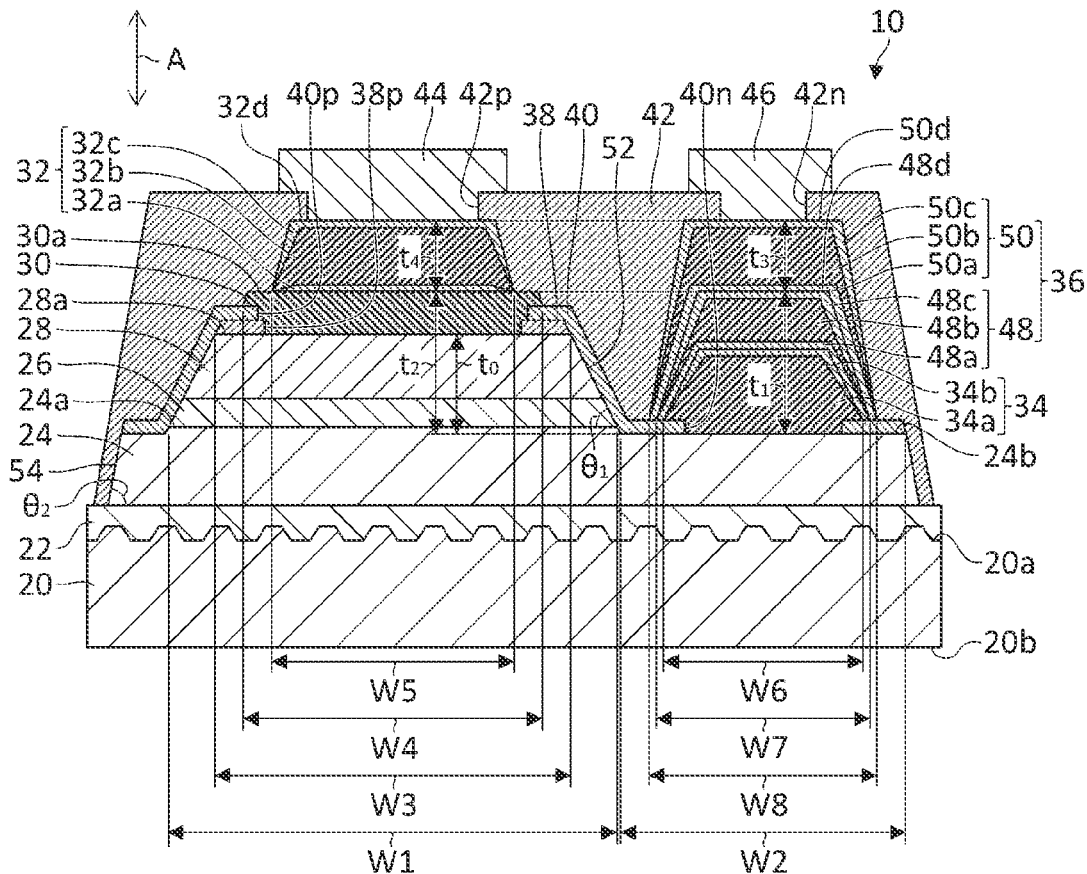
FIG. 1 is a cross-sectional view schematically illustrating a structure of a semiconductor light-emitting element according to a first embodiment.

The invention will now be described by reference to the preferred embodiments. This does not intend to limit the scope of the present invention, but to exemplify the invention.

A description will be given of an embodiment of the present invention with reference to the drawings. The same numerals are used in the description to denote the same elements, and a duplicate description is omitted as appropriate. To facilitate the understanding, the relative dimensions of the constituting elements in the drawings do not necessarily mirror the relative dimensions in the light-emitting element.

The semiconductor light-emitting element of this embodiment is designed to emit "deep ultraviolet light" having a central wavelength $\lambda$ of about 360 nm or shorter, which is a so-called deep ultraviolet-light emitting diode (DUV-LED). To output deep ultraviolet light having such wavelength, an aluminum gallium nitride (AlGaN)-based semiconductor material having a band gap of about 3.4 eV or larger is used. The embodiment will particularly deal with a case of emitting deep ultraviolet light having a central wavelength $\lambda$ of about 240 nm to 320 nm.

In this specification, the term "AlGaN-based semiconductor material" refers to a semiconductor material containing at least aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0<x+y\leq1$, $0<x<1$, $0<y<1$). The AlGaN-based semiconductor material shall encompass AlGaN or InAlGaN. The "AlGaN-based semiconductor material" in this specification has a molar fraction of AlN and a molar fraction of GaN of 1% or higher, and, preferably, 5% or higher, 10% or higher, or 20% or higher.

Those materials that do not contain AlN may be distinguished by referring to them as "GaN-based semiconductor materials". "GaN-based semiconductor materials" include GaN or InGaN. Similarly, those materials that do not contain GaN may be distinguished by referring to them as "AlN-based semiconductor materials". "AlN-based semiconductor materials" include AlN or InAlN.

First Embodiment

FIG. 1 is a cross-sectional view schematically illustrating a structure of a semiconductor light-emitting element 10 according to a first embodiment. The semiconductor light-emitting element 10 includes a substrate 20, a base layer 22, an n-type semiconductor layer 24, an active layer 26, a p-type semiconductor layer 28, a p-side contact electrode 30, a p-side current diffusion layer 32, an n-side contact electrode 34, an n-side current diffusion layer 36, a first protective layer 38, a second protective layer 40, a third protective layer 42, a p-side pad electrode 44, and an n-side pad electrode 46.

Referring to FIG. 1, the direction indicated by arrow A may be referred to as "vertical direction" or "direction of thickness". As viewed from the substrate 20, the direction away from the substrate 20 may be referred to as upward, and the direction towards the substrate 20 may be referred to as downward.

The substrate 20 has a first principal surface 20a, and a second principal surface 20b opposite to the first principal surface 20a. The first principal surface 20a is a crystal growth surface on which the individual layers from the base layer 22 to the p-type semiconductor layer 28 are grown. The substrate 20 is made of a material that is transparent to the deep ultraviolet light emitted from the semiconductor light-emitting element 10, and is made of sapphire ($Al_2O_3$) for example. A fine uneven pattern having a submicron (1 μm or smaller) depth and pitch is formed on the first principal surface 20a. Such substrate 20 is also referred to as a patterned sapphire substrate (PSS). The second principal surface 20b is a light extraction surface through which the deep ultraviolet light emitted from the active layer 26 is extracted to the outside. The substrate 20 may be composed of AlN or AlGaN. The substrate 20 may alternatively be a normal substrate with the first principal surface 20a composed of a flat surface remained unpatterned.

The base layer 22 is provided on the first principal surface 20a of the substrate 20. The base layer 22 is an underlying layer (template layer) on which the n-type semiconductor layer 24 is formed. The base layer 22 is typically composed of an undoped AlN, and is specifically composed of an AlN grown at high temperatures (HT-AlN; High Temperature AlN). The base layer 22 may include an AlN layer, and an undoped AlGaN layer formed on the AlN layer. The base layer 22 may be composed solely of the undoped AlGaN layer, when the substrate 20 is an AlN substrate or an AlGaN substrate. The base layer 22 includes at least either an undoped AlN layer or an undoped AlGaN layer.

The n-type semiconductor layer 24 is provided on the base layer 22. The n-type semiconductor layer 24 is composed of an n-type AlGaN-based semiconductor material, and typically doped with Si as an n-type impurity. The n-type semiconductor layer 24 has a composition ratio selected so as to allow therethrough transmission of the deep ultraviolet light emitted from the active layer 26, and is preferably designed to have a molar fraction of AlN of 25% or larger, which is preferably 40% or larger, or 50% or larger. The n-type semiconductor layer 24 is designed to have a band gap larger than the wavelength of the deep ultraviolet light emitted from the active layer 26, typically so as to have a band gap of 4.3 eV or larger. The n-type semiconductor layer 24 is preferably designed to have a molar fraction of AlN of 80% or smaller, that is, a band gap of 5.5 eV or smaller, and is more preferably designed to have a molar fraction of AlN of 70% or smaller (that is, a band gap of 5.2 eV or smaller). The n-type semiconductor layer 24 has a thickness of about 1 μm to 3 μm, and typically has a thickness of about 2 μm.

The n-type semiconductor layer 24 is designed to have a concentration of Si as an impurity equal to or higher than $1 \times 10^{18}/cm^3$ and equal to or lower than $5 \times 10^{19}/cm^3$. The n-type semiconductor layer 24 is more preferably designed to have a Si concentration equal to or higher than $5 \times 10^{18}/cm^3$ and equal to or lower than $3 \times 10^{19}/cm^3$, which is more preferably equal to or higher than $7 \times 10^{18}/cm^3$ and equal to or lower than $2 \times 10^{19}/cm^3$. In one embodiment, the Si concentration in the n-type semiconductor layer 24 is around $1 \times 10^{19}/cm^3$, and specifically in the range equal to or higher than $8 \times 10^{18}/cm^3$ and equal to or lower than $1.5 \times 10^{19}/cm^3$.

The n-type semiconductor layer 24 has a first upper surface 24a and a second upper surface 24b. The first upper surface 24a is a part on which the active layer 26 is formed. The second upper surface 24b is a part on which the n-side contact electrode 34 is formed, rather than the active layer 26. The first upper surface 24a and the second upper surface 24b have different levels of height, wherein the height of the first upper surface 24a above the level of substrate 20 is larger than the height of the second upper surface 24b above the level of the substrate 20. The region where the first upper surface 24a is located is defined as a "first region W1", and the region where the second upper surface 24b is located is defined as a "second region W2".

The active layer 26 is provided on the first upper surface 24a of the n-type semiconductor layer 24. The active layer 26 is made of an AlGaN-based semiconductor material, and forms a double heterojunction structure while being sandwiched between the n-type semiconductor layer 24 and the p-type semiconductor layer 28. The active layer 26 is designed to have a band gap of 3.4 eV or larger to output deep ultraviolet light having a wavelength of 355 nm or shorter. For example, the AlN composition ratio of the active layer 26 is selected so as to output deep ultraviolet light having a wavelength of 320 nm or shorter.

The active layer 26 may have, for example, a monolayer or multilayer quantum well structure. The active layer 26 is composed of a stack of a barrier layer made of an undoped AlGaN-based semiconductor material, and a well layer made of an undoped AlGaN-based semiconductor material. The active layer 26 includes, for example, a first barrier layer directly in contact with the n-type semiconductor layer 24, and a first well layer provided on the first barrier layer. One or more pairs of the well layer and the barrier layer may be additionally provided between the first barrier layer and the first well layer. Each of the barrier layer and the well layer has a thickness of about 1 nm to 20 nm, which is typically 2 nm to 10 nm.

The active layer 26 may further include an electron blocking layer directly in contact with the p-type semiconductor layer 28. The electron blocking layer is made of an undoped AlGaN-based semiconductor material, and is designed to have a molar fraction of AlN of 40% or larger, and preferably 50% or larger. The electron blocking layer may alternatively be designed to have a molar fraction of AlN of 80% or larger, and may also be made of an AlN-based semiconductor material free of GaN. The electron blocking layer has a thickness of about 1 nm to 10 nm, which is typically about 2 nm to 5 nm.

The p-type semiconductor layer 28 is provided on the active layer 26. The p-type semiconductor layer 28 is made of a p-type AlGaN-based semiconductor material or a p-type GaN-based semiconductor material, and is typically composed of AlGaN or GaN doped with magnesium (Mg) as a p-type impurity. The p-type semiconductor layer 28 typically has a thickness of about 300 nm to 1400 nm. For example, a height $t_0$ of the upper surface 28a of the p-type semiconductor layer 28 above the level of the second upper surface 24b of the n-type semiconductor layer 24 is designed as equal to or larger than 400 nm and equal to or smaller than 1500 nm.

The p-type semiconductor layer 28 may be comprised of a plurality of layers. The p-type semiconductor layer 28 may typically have a p-type clad layer and a p-type contact layer. The p-type clad layer is a p-type AlGaN layer having a larger percentage of AlN than in the p-type contact layer, and is provided directly in contact with the active layer 26. The p-type contact layer is a p-type AlGaN layer or a p-type GaN layer, having a smaller AlN percentage than in the p-type clad layer. The p-type contact layer is provided on the p-type clad layer, so as to directly be in contact with the p-side contact electrode 30.

The p-type clad layer is designed to have a composition ratio selected so as to allow therethrough transmission of the deep ultraviolet light emitted from the active layer 26. The p-type clad layer is designed to have a molar fraction of AlN of 25% or larger, which is preferably 40% or larger, or 50% or larger. The AlN percentage of the p-type clad layer is typically equivalent to the AlN percentage of the n-type semiconductor layer 24, or larger than the AlN percentage of the n-type semiconductor layer 24. The AlN percentage of the p-type clad layer may be 70% or larger, or 80% or larger.

The p-type clad layer has a thickness of about 10 nm to 100 nm, which is typically about 15 nm to 70 nm.

The p-type contact layer, intended for attaining good ohmic contact with the p-side contact electrode 30, is designed to have an AlN percentage of 20% or smaller, which is preferably 10% or smaller, 5% or smaller, or 0%. That is, the p-type contact layer may also be composed of a p-type GaN-based semiconductor material free of AlN. The p-type contact layer has a thickness of about 300 nm to 1500 nm, which is typically about 500 nm to 1000 nm.

The p-side contact electrode 30 is provided on the p-type semiconductor layer 28, in contact with the upper surface 28a of the p-type semiconductor layer 28. The p-side contact electrode 30 is made of a material capable of forming ohmic contact with the p-type semiconductor layer 28, and is typically made of a transparent conductive oxide (TCO) such as tin oxide ($SnO_2$), zinc oxide (ZnO), or indium tin oxide (ITO). The p-side contact electrode 30 has a thickness of about 20 nm to 500 nm, which is preferably 50 nm or larger, and more preferably 100 nm or larger.

The p-side contact electrode 30 is provided so as to close a first p-side contact opening 38p in the first protective layer 38, and a second p-side contact opening 40p in the second protective layer 40. The p-side contact electrode 30 is provided so as to overlap the first protective layer 38 and the second protective layer 40. A fourth region W4 in which the p-side contact electrode 30 is formed is, therefore wider than an opening region of each of the first p-side contact opening 38p and the second p-side contact opening 40p. In a plan view of the semiconductor light-emitting element 10 when seen through in the thickness direction, the entire opening region of each of the first p-side contact opening 38p and the second p-side contact opening 40p falls inside the fourth region W4. Moreover, the fourth region W4 in which the p-side contact electrode 30 is formed is smaller than a third region W3 in which the upper surface 28a of the p-type semiconductor layer 28 is located. In a plan view of the semiconductor light-emitting element 10 when seen through in the thickness direction, the entire fourth region W4 falls inside the third region W3. The area of the fourth region W4 in which the p-side contact electrode 30 is formed typically accounts for 80% or more, or 90% or more, of the third region W3 in which the upper surface 28a of the p-type semiconductor layer 28 is located.

The p-side current diffusion layer 32 is provided on the p-side contact electrode 30. A fifth region W5 in which the p-side current diffusion layer 32 is formed is smaller than the fourth region W4 in which the p-side contact electrode 30 is located. In a plan view of the semiconductor light-emitting element 10 when seen through in the thickness direction, the entire fifth region W5 falls inside the fourth region W4. The area of the fifth region W5 in which the p-side current diffusion layer 32 is formed typically accounts for 80% or more, or 90% or more, of the fourth region W4 in which the p-side contact electrode 30 is located. The p-side current diffusion layer 32 preferably has a certain thickness, in order to laterally (horizontally) diffuse the current injected from the p-side pad electrode 44. The thickness of the p-side current diffusion layer 32 is 300 nm or larger and 1500 nm or smaller, and is typically about 500 nm to 1000 nm.

The p-side current diffusion layer 32 has a stacked structure in which a first TiN layer 32a, a metal layer 32b, and a second TiN layer 32c are stacked in order. The first TiN layer 32a and the second TiN layer 32c are composed of conductive titanium nitride (TiN). Conductivity of conductive TiN is $1\times10^{-5}$ Ω·m or smaller, and is typically about $4\times10^{-7}$ Ω·m.

The thickness of each of the first TiN layer 32a and the second TiN layer 32c is 10 nm or larger, and is typically about 50 nm to 200 nm.

The metal layer 32b in the p-side current diffusion layer 32 is composed of a single metal layer or a plurality of metal layers. The metal layer 32b is composed of a metal material such as titanium (Ti), chromium (Cr), nickel (Ni), aluminum (Al), platinum (Pt), palladium (Pd) or rhodium (Rh). The metal layer 32b may have a structure in which a plurality of metal layers of different materials are stacked. The metal layer 32b may alternatively have a structure in which a first metal layer made of a first metal material, and a second metal layer made of a second metal material are stacked, or may have a structure in which a plurality of first metal layers and a plurality of second metal layers are alternately stacked. The metal layer 32b may further have a third metal layer composed of a third metal material. The metal layer 32b is thicker than each of the first TiN layer 32a and the second TiN layer 32c. The thickness of the metal layer 32b is 100 nm or larger, and is typically about 300 nm to 800 nm.

The n-side contact electrode 34 is provided on the second upper surface 24b of the n-type semiconductor layer 24, in contact with the n-type semiconductor layer 24. The n-side contact electrode 34 is provided so as to close an n-side contact opening 40n in the second protective layer 40. The n-side contact electrode 34 is provided so as to overlap the second protective layer 40. A sixth region W6 in which the n-side contact electrode 34 is formed is larger than the opening region of an n-side contact opening 40n. In a plan view of the semiconductor light-emitting element 10 when seen through in the thickness direction, the entire opening region of the n-side contact opening 40n falls inside the fourth region W4.

The n-side contact electrode 34 has a metal layer 34a and a TiN layer 34b. The metal layer 34a is composed of a material capable of forming an ohmic contact with the n-type semiconductor layer 24, and having a large reflectance to deep ultraviolet light emitted from the active layer 26. The metal layer 34a typically includes a Ti layer in direct contact with the n-type semiconductor layer 24, and an aluminum (Al) layer in direct contact with the Ti layer. The thickness of the Ti layer is about 1 nm to 10 nm, preferably 5 nm or smaller, and more preferably 1 nm to 2 nm. The ultraviolet reflectivity of the n-side contact electrode 34, when viewed from the n-type semiconductor layer 24, may be enhanced by thinning the Ti layer. The thickness of the Al layer is preferably 200 nm or larger, and is typically about 300 nm to 1000 nm. The ultraviolet reflectivity of the n-side contact electrode 34 may be enhanced, by thickening the Al layer. The metal layer 34a may further have a Ti layer provided on the Al layer.

The TiN layer 34b is provided on the metal layer 34a, and is composed of a conductive TiN. Conductivity of conductive TiN is $1\times10^{-5}$ Ω·m or smaller, and is typically about $4\times10^{-7}$ Ω·m. The thickness of the TiN layer 34b is 10 nm or larger, and is typically about 50 nm to 200 nm.

The n-side current diffusion layer 36 is provided on the n-side contact electrode 34. The n-side current diffusion layer 36 is provided over an eighth region W8, which is wider than the sixth region W6 in which the n-side contact electrode 34 is located. In a plan view of the semiconductor light-emitting element 10 when seen through in the thickness direction, the entire sixth region W6 falls inside the eighth region W8. The n-side current diffusion layer 36 therefore covers the entire upper surface and side face of the n-side contact electrode 34, thus preventing the upper surface or side face of the n-side contact electrode 34 from being exposed.

The n-side current diffusion layer 36 includes a first current diffusion layer 48 and a second current diffusion layer 50. The first current diffusion layer 48 is provided on the n-side contact electrode 34. The first current diffusion layer 48 is provided over a seventh region W7, which is wider than the sixth region W6 in which the n-side contact electrode 34 is formed. In a plan view of the semiconductor light-emitting element 10 when seen through in the thickness direction, the entire sixth region W6 falls inside the seventh region W7. The first current diffusion layer 48, therefore covers the entire upper surface and side face of the n-side contact electrode 34, thus preventing the upper surface or side face of the n-side contact electrode 34 from being exposed. The first current diffusion layer 48 is provided in contact with the second protective layer 40, but is not in contact with the n-type semiconductor layer 24. The thickness of the first current diffusion layer 48 is 100 nm or larger and 1000 nm or smaller, and is typically about 200 nm to 800 nm.

The second current diffusion layer 50 is provided on the first current diffusion layer 48. The second current diffusion layer 50 is provided over the eighth region W8, which is wider than the seventh region W7 in which the first current diffusion layer 48 is formed. In a plan view of the semiconductor light-emitting element 10 when seen through in the thickness direction, the entire seventh region W7 falls inside the eighth region W8. The second current diffusion layer 50, therefore covers the entire upper surface and side face of the first current diffusion layer 48, thus preventing the upper surface or side face of the first current diffusion layer 48 from being exposed. The second current diffusion layer 50 is provided in contact with the second protective layer 40, but is not in contact with the n-type semiconductor layer 24. The thickness of the second current diffusion layer 50 is 300 nm or larger and 1500 nm or smaller, and is typically about 500 nm to 1000 nm.

The first current diffusion layer 48 has a stacked structure in which a first TiN layer 48a, a metal layer 48b, and a second TiN layer 48c are stacked in order. The first TiN layer 48a and the second TiN layer 48c are composed of conductive TiN. Conductivity of conductive TiN is $1 \times 10^{-5}$ Ω·m or smaller, and is typically about $4 \times 10^{-7}$ Ω·m. The thickness of each of the first TiN layer 48a and the second TiN layer 48c is 10 nm or larger, and is typically about 50 nm to 200 nm.

The metal layer 48b included in the first current diffusion layer 48 is composed of a single metal layer or a plurality of metal layers. The metal layer 48b is composed of a metal material such as titanium (Ti), chromium (Cr), nickel (Ni), aluminum (Al), platinum (Pt), palladium (Pd) or rhodium (Rh). The metal layer 48b may also have a structure in which a plurality of metal layers of different materials are stacked. The metal layer 48b may have a structure in which a first metal layer made of a first metal material and a second metal layer made of a second metal material are stacked, or may have a structure in which a plurality of first metal layers and a plurality of second metal layers are alternately stacked. The metal layer 48b may further have a third metal layer composed of a third metal material. The metal layer 48b is thicker than each of the first TiN layer 48a and the second TiN layer 48c. The thickness of the metal layer 48b is 100 nm or larger, and is typically about 200 nm to 800 nm.

The first current diffusion layer 48 is formed so as to align the height level with the p-side contact electrode 30. That is, the height level of an upper surface 48d of the first current diffusion layer 48 substantially coincides with the height level of the upper surface 30a of the p-side contact electrode 30. Specifically, the difference between the height levels of the upper surface 48d of the first current diffusion layer 48 and the height level of the upper surface 30a of the p-side contact electrode 30 is adjusted to 100 nm or smaller, and preferably to 50 nm or smaller. Although a reference level of height is not particularly limited, when the second upper surface 24b of the n-type semiconductor layer 24 is used as a reference, a difference between thickness $t_1$ measured from the second upper surface 24b to the upper surface 48d of the first current diffusion layer 48, and thickness $t_2$ measured from the upper surface 24b to the upper surface 30a of the p-side contact electrode 30, is adjusted to 100 nm or smaller, or 50 nm or smaller. The height level of the upper surface 48d of the first current diffusion layer 48 may be higher than, or lower than, or exactly equal to the height level of the upper surface 30a of the p-side contact electrode 30.

The second current diffusion layer 50 has a stacked structure in which a first TiN layer 50a, a metal layer 50b, and a second TiN layer 50c are stacked in order. The second current diffusion layer 50 is structured similarly to the p-side current diffusion layer 32, so as to equalize thickness $t_3$ of the second current diffusion layer 50 and thickness $t_4$ of the p-side current diffusion layer 32. Hence, the height level of an upper surface 50d of the second current diffusion layer 50 substantially coincides with the height level of an upper surface 32d of the p-side current diffusion layer 32. Specifically, the difference between the height level of the upper surface 50d of the second current diffusion layer 50 and the height level of the upper surface 32d of the p-side current diffusion layer 32 is adjusted to 100 nm or smaller, and preferably to 50 nm or smaller. The height level of the upper surface 50d of the second current diffusion layer 50 may be higher than, or lower than, or exactly equal to the height level of the upper surface 32d of the p-side current diffusion layer 32.

A first protective layer 38 is provided on the p-type semiconductor layer 28. The first protective layer 38 covers the upper surface 28a of the p-type semiconductor layer 28 in an area different from the first p-side contact opening 38p. The first protective layer 38 is composed of a dielectric material such as silicon oxide ($SiO_2$) or silicon oxynitride (SiON). The first protective layer 38 has a thickness of 50 nm or larger, and typically 100 nm or larger and 500 nm or smaller.

The second protective layer 40 is provided on the second upper surface 24b of the n-type semiconductor layer 24, on the first protective layer 38, and on a first mesa face 52 of the semiconductor light-emitting element 10. The second protective layer 40 is composed of a dielectric material such as aluminum oxide ($Al_2O_3$). The thickness of the second protective layer 40 may be 5 nm or larger and 50 nm or smaller, and may be about 10 nm to 30 nm for example.

The second protective layer 40 covers the second upper surface 24b of the n-type semiconductor layer 24 in an area different from the n-side contact opening 40n. The second protective layer 40 covers the first protective layer 38 in an area different from the second p-side contact opening 40p. The opening area of the second p-side contact opening 40p is wider than the opening area of the first p-side contact opening 38p. In a plan view of the semiconductor light-emitting element 10 when seen through in the thickness direction, the entire opening region of the first p-side contact opening 38p falls inside the opening region of the second p-side contact opening 40p.

The second protective layer 40 covers the first mesa face 52. The first mesa face 52 is a side face inclined at a first angle $\theta_1$ inside the first region W1, and includes a first side face of the n-type semiconductor layer 24, a side face of the active layer 26, a side face of the p-type semiconductor layer 28, and a side face of the first protective layer 38. The first angle $\theta_1$ at which the first mesa face 52 inclines is equal to or larger than 15° and equal to or smaller than 50°, and typically equal to or larger than 20° and equal to or smaller than 40°. The first angle $\theta_1$, when expressed with use of refractive index n of the active layer 26, is preferably given by $\theta_1 < \{\pi/2 + \sin^{-1}(1/n)\}/2$. With the first angle $\theta_1$ preset to such value, the ultraviolet light may be totally reflected on the second principal surface 20b of the substrate 20, and may be prevented from being blocked to be output to the outside of the substrate 20.

A third protective layer 42 is provided so as to cover the entire part of the semiconductor light-emitting element 10. The third protective layer 42 is composed of a dielectric material such as silicon oxide ($SiO_2$), silicon oxynitride (SiON), silicon nitride (SiN), aluminum nitride (AlN) or aluminum oxynitride (AlON). The thickness of the third protective layer 42 is 100 nm or larger, and is typically about 500 nm to 2000 nm.

The third protective layer 42 is provided on the p-side contact electrode 30, the p-side current diffusion layer 32, the n-side current diffusion layer 36, the second protective layer 40, and a second mesa face 54 of the semiconductor light-emitting element 10. The third protective layer 42 covers the p-side current diffusion layer 32 in an area different from the p-side pad opening 42p, and covers the n-side current diffusion layer 36 in an area different from the n-side pad opening 42n. The second mesa face 54 is a side face inclined at a second angle $\theta_2$ that is larger than the first angle $\theta_1$, outside the first region W1 and the second region W2, and includes a second side face of the n-type semiconductor layer 24. The second angle $\theta_2$ at which the second mesa face 54 inclines is equal to or larger than 55° and smaller than 70° (excluding 70°), and is typically about 60° to 65°.

A p-side pad electrode 44 and an n-side pad electrode 46 are parts used for bonding of the semiconductor light-emitting element 10 when mounted onto a package substrate or the like. The p-side pad electrode 44 is provided on the p-side current diffusion layer 32, and is brought into contact with the p-side current diffusion layer 32 to be electrically connected to the p-side contact electrode 30. The p-side pad electrode 44 is provided so as to close the p-side pad opening 42p, and overlaps the third protective layer 42. The n-side pad electrode 46 is provided on the n-side current diffusion layer 36, and is brought into contact with the n-side current diffusion layer 36 to be electrically connected to the n-side contact electrode 34. The n-side pad electrode 46 is provided so as to close the n-side pad opening 42n and overlaps the third protective layer 42.

Each of the p-side pad electrode 44 and the n-side pad electrode 46 is structured to contain Au in view of corrosion resistance, and is typically composed of a stacked structure of Ni/Au, Ti/Au, or Ti/Pt/Au. Each of the p-side pad electrode 44 and the n-side pad electrode 46 may further include a metal layer made of a metal bonding material for bonding, and may further contain, for example, a gold tin alloy (AuSn) layer, or a stacked structure of an Sn layer and an Au layer.

Figure 2:
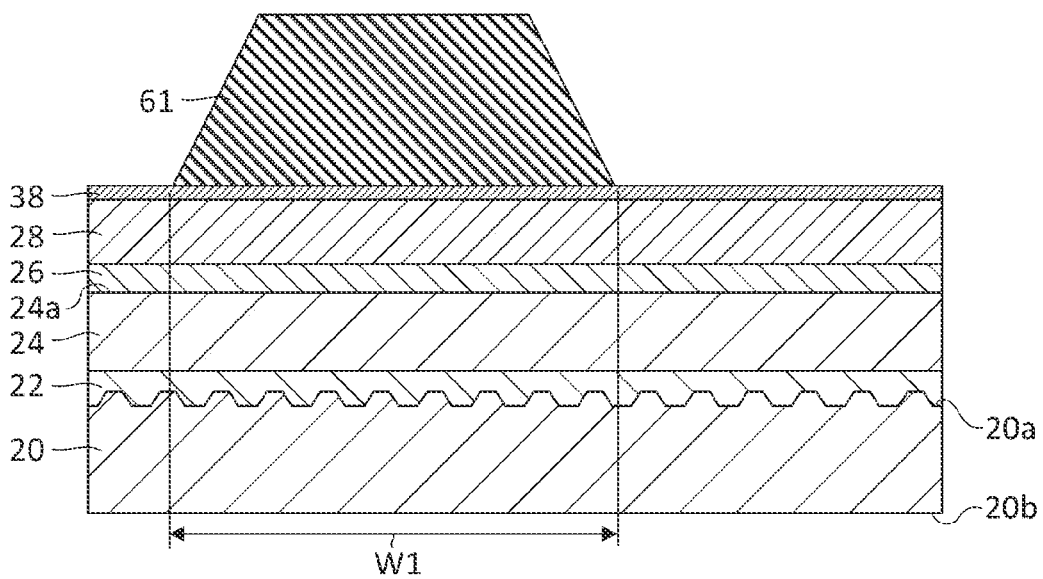
FIG. 2 is a drawing schematically illustrating a manufacturing process of the semiconductor light-emitting element.

Next, a method for manufacturing the semiconductor light-emitting element 10 will be explained. FIGS. 2 to 13 are drawings schematically illustrating processes of manufacturing of the semiconductor light-emitting element 10. Referring first to FIG. 2, the base layer 22, the n-type semiconductor layer 24, the active layer 26, the p-type semiconductor layer 28, and the first protective layer 38 are formed on the first principal surface 20a of the substrate 20 in order. The active layer 26 is formed on the first upper surface 24a of the n-type semiconductor layer 24.

The substrate 20 is, for example, a patterned sapphire substrate. The base layer 22 includes, for example, an HT-AlN layer and an undoped AlGaN layer. The n-type semiconductor layer 24, the active layer 26, and the p-type semiconductor layer 28 are semiconductor layers composed of an AlGaN-based semiconductor material, an AlN-based semiconductor material, or a GaN-based semiconductor material, and may be formed by using any of known epitaxial growth methods such as metal organic vapor phase epitaxy (MOVPE) or molecular beam epitaxy (MBE). The first protective layer 38 is made of $SiO_2$ or SiON, and can be formed by any of known technologies such as chemical vapor deposition (CVD).

Next, again referring to FIG. 2, a first mask 61 is formed on the first protective layer 38. The first mask 61 is an etching mask used for forming the first mesa face 52 illustrated in FIG. 1. The first mask 61 may be formed by any of known lithographic technologies. The first mask 61 is provided in an area corresponded to the first region W1 illustrated in FIG. 1. The side face of the first mask 61 is inclined. The angle of inclination of the side face of the first mask 61 is preset so that the obtainable first mesa face 52 will be inclined at the first angle $\theta_1$ in the subsequent etching process.

Figure 3:
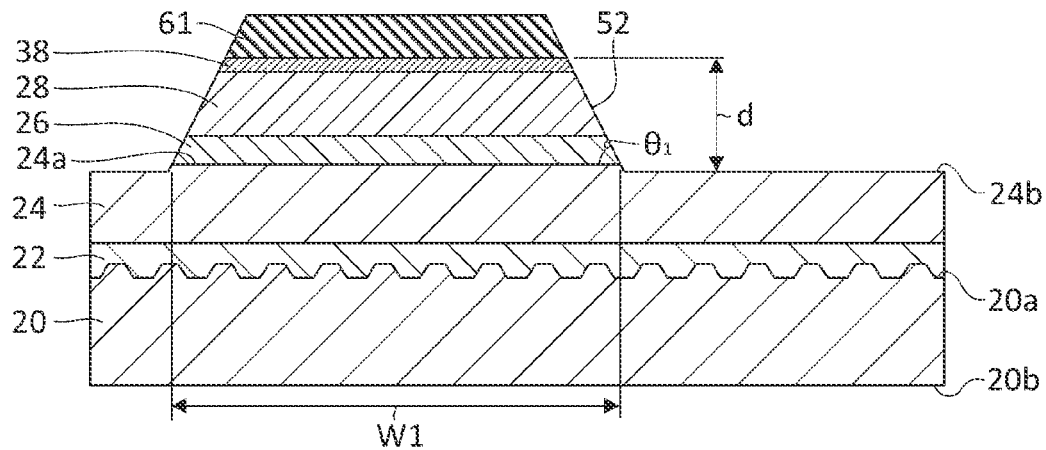
FIG. 3 is a drawing schematically illustrating a manufacturing process of the semiconductor light-emitting element.

Next, referring to FIG. 3, the first protective layer 38, the p-type semiconductor layer 28 and the active layer 26 are etched from above the first mask 61, so as to expose the n-type semiconductor layer 24 in a region not overlapped with the first mask 61. Etch depth d in this etching process corresponds to the total thickness of the active layer 26, the p-type semiconductor layer 28, and the first protective layer 38, and is typically equal to or larger than 400 nm and equal to or smaller than 1500 nm. As a result of this etching process, the first mesa face 52 inclined at the first angle $\theta_1$ is formed, and the second upper surface 24b of the n-type semiconductor layer 24 is formed.

The etching process illustrated in FIG. 3 can employ reactive ion etching with use of chlorine-containing etching gas, which is typically inductively coupled plasma (ICP) etching. The etching gas employable here is exemplified by chlorine (Cl)-containing reactive gas such as chlorine ($Cl_2$), boron trichloride ($BCl_3$) and silicon tetrachloride ($SiCl_4$). Note that dry etching based on combination of a reactive gas and an inert gas is also employable, wherein the chlorine-containing gas may be mixed with a rare gas such as argon (Ar). After the first mesa face 52 and the second upper surface 24b are formed, the first mask 61 is removed.

Figure 4:
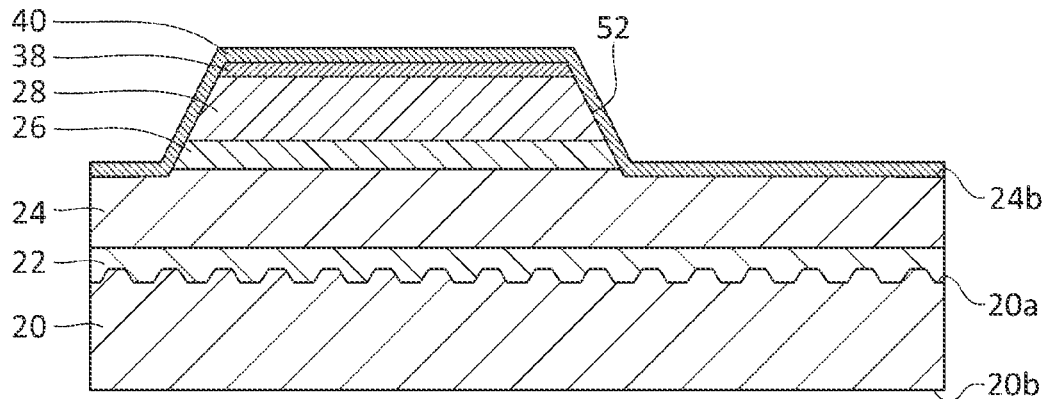
FIG. 4 is a drawing schematically illustrating a manufacturing process of the semiconductor light-emitting element.

Next, referring to FIG. 4, the second protective layer 40 is formed. The second protective layer 40 covers the second upper surface 24b of the n-type semiconductor layer 24, the first protective layer 38, the first side face of the n-type semiconductor layer 24, the side face of the active layer 26, and the side face of the p-type semiconductor layer 28 (that is, the first mesa face 52). The second protective layer 40 is typically composed of $Al_2O_3$, and may be formed by atomic layer deposition (ALD) with use of trimethylaluminum (TMA), as well as $O_2$ plasma or $O_3$ as starting materials.

Figure 5:
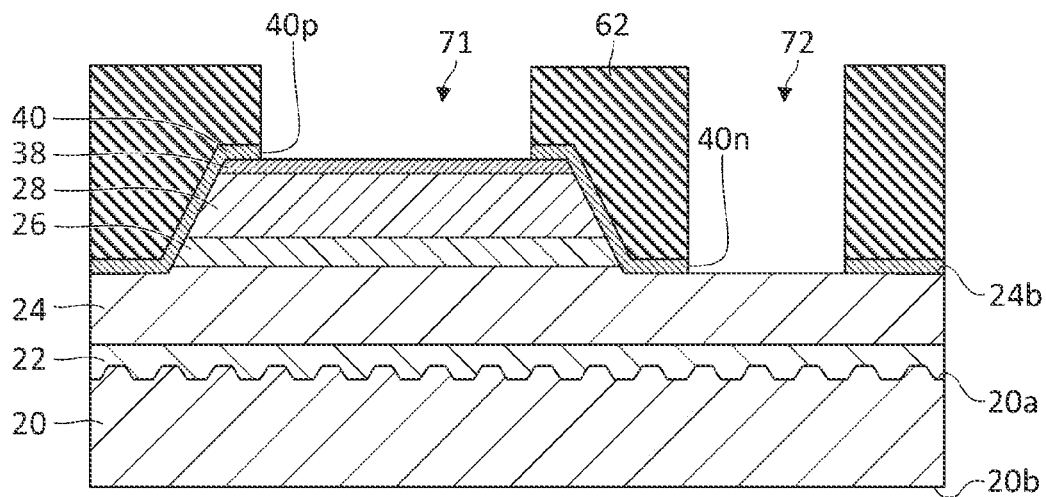
FIG. 5 is a drawing schematically illustrating a manufacturing process of the semiconductor light-emitting element.

Next, referring to FIG. 5, a second mask 62 is formed on the second protective layer 40, and the second protective layer 40 is removed in a first opening 71 and a second opening 72 where the second mask 62 is not provided. The second mask 62 may be formed by any of known lithographic technologies. The second protective layer 40 may be dry-etched by using a chlorine-containing gas, or a mixed gas of a chlorine-containing gas and a rare gas. As a result of this etching process, the second p-side contact opening 40p and the n-side contact opening 40n are formed. In the second p-side contact opening 40p, the first protective layer 38 is exposed. In the n-side contact opening 40n, the second upper surface 24b of the n-type semiconductor layer 24 is exposed. After the second p-side contact opening 40p and the n-side contact opening 40n are formed, the second mask 62 is removed.

Figure 6:
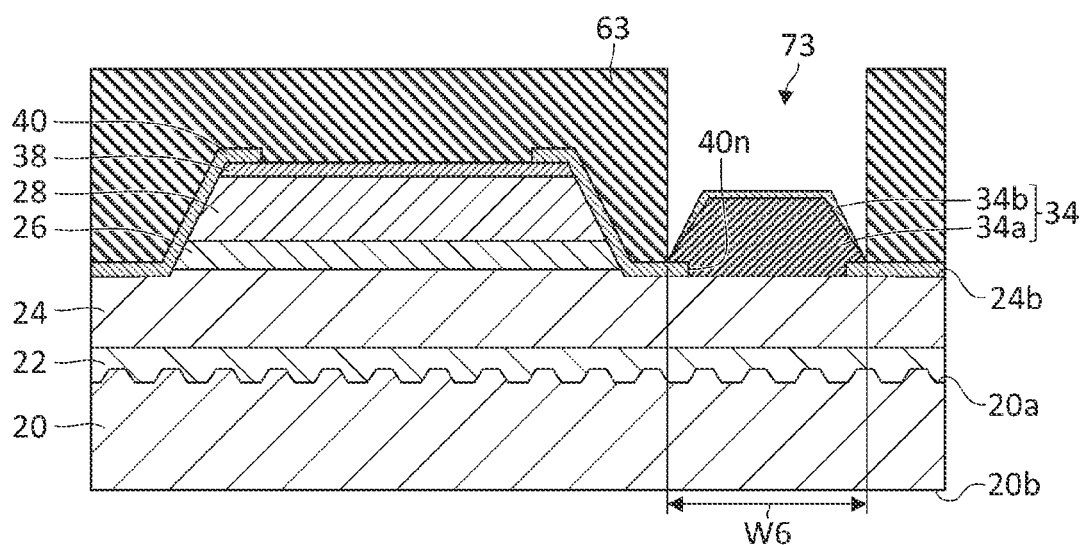
FIG. 6 is a drawing schematically illustrating a manufacturing process of the semiconductor light-emitting element.

Next, referring to FIG. 6, a third mask 63 is formed on the second protective layer 40, and the n-side contact electrode 34 is formed in a third opening 73 where the third mask 63 is not provided. The third mask 63 may be formed by any of known lithographic technologies. The third opening 73 is located in the sixth region W6 in which the n-side contact electrode 34 will be formed. The opening area of the third opening 73 is larger than the opening area of the n-side contact opening 40n. In the third opening 73, the metal layer 34a is formed first. The metal layer 34a has a Ti layer, an Al layer and a Ti layer that are stacked in order. Next, the TiN layer 34b is formed on the metal layer 34a. Each layer of the metal layer 34a and the TiN layer 34b may be formed by sputtering or EB evaporation.

Next, the third mask 63 is removed, and the n-side contact electrode 34 is annealed. The n-side contact electrode 34 is annealed at a temperature below the melting point of Al (about 660° C.), typically at a temperature equal to or higher than 500° C. and equal to or lower than 650° C., and preferably at a temperature equal to or higher than 550° C. and equal to or lower than 625° C. The annealing can reduce the contact resistance of the n-side contact electrode 34 down to $1 \times 10^{-2}$ $\Omega \cdot cm^2$ or below. With the annealing temperature controlled below the melting point of Al, the annealed n-side contact electrode 34 will have an improved planarity, and an ultraviolet reflectivity of 80% or larger, or 90% or larger.

Figure 7:
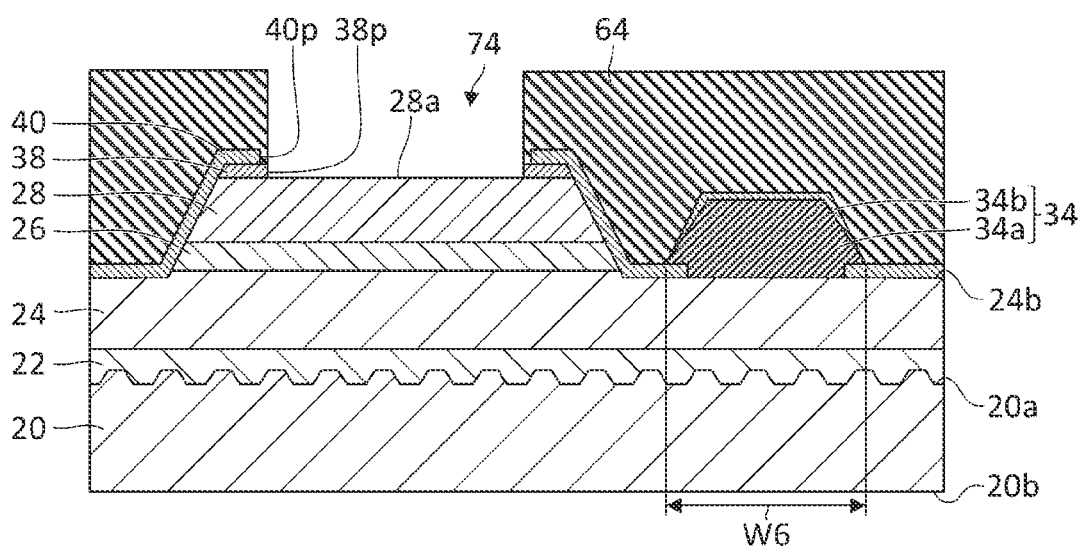
FIG. 7 is a drawing schematically illustrating a manufacturing process of the semiconductor light-emitting element.

Next, referring to FIG. 7, a fourth mask 64 is formed on the n-side contact electrode 34 and the second protective layer 40, and the first protective layer 38 is removed in a fourth opening 74 where the fourth mask 64 is not provided. The fourth mask 64 may be formed by using any of known photolithographic technique. The opening area of the fourth opening 74 is smaller than the opening area of the second p-side contact opening 40p. The first protective layer 38 may be removed by using buffered hydrofluoric acid (BHF) which is a mixed solution of hydrofluoric acid (HF) and ammonium fluoride ($NH_4F$). By removing the first protective layer 38 in the fourth opening 74, the first p-side contact opening 38p is formed. In the first p-side contact opening 38p, the upper surface 28a of the p-type semiconductor layer 28 is exposed. Wet-etching of the first protective layer 38 can reduce a damage possibly exerted on the upper surface 28a of the p-type semiconductor layer 28, as compared with a case where the first protective layer 38 is dry-etched. After forming the first p-side contact opening 38p, the fourth mask 64 is removed.

Figure 8:
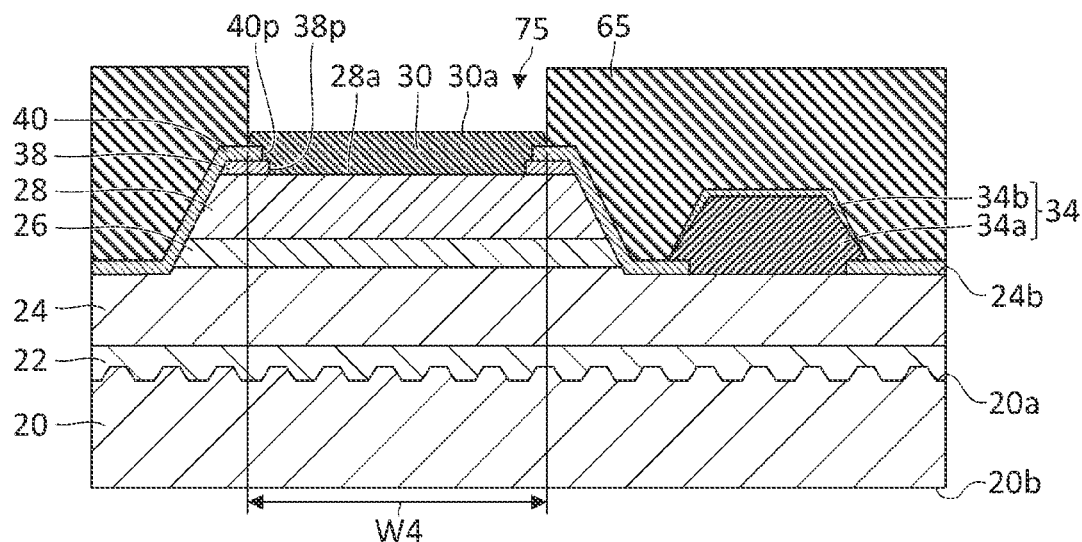
FIG. 8 is a drawing schematically illustrating a manufacturing process of the semiconductor light-emitting element.

Next, referring to FIG. 8, a fifth mask 65 is formed on the n-side contact electrode 34 and the second protective layer 40, and the p-side contact electrode 30 is formed in a fifth opening 75 where the fifth mask 65 is not provided. The fifth opening 75 is located in the fourth region W4 illustrated in FIG. 1. The opening area of the fifth opening 75 is larger than the opening area of the first p-side contact opening 38p and the opening area of the second p-side contact opening 40p. The p-side contact electrode 30 is provided in contact with the upper surface 28a of the p-type semiconductor layer 28, so as to close the first p-side contact opening 38p and the second p-side contact opening 40p. The p-side contact electrode 30 is typically made of ITO, and may be formed by sputtering.

Next, the fifth mask 65 is removed, and the p-side contact electrode 30 is annealed. The annealing can reduce the contact resistance of the p-side contact electrode 30 down to $1 \times 10^{-2}$ $\Omega \cdot cm^2$ or below.

Figure 9:
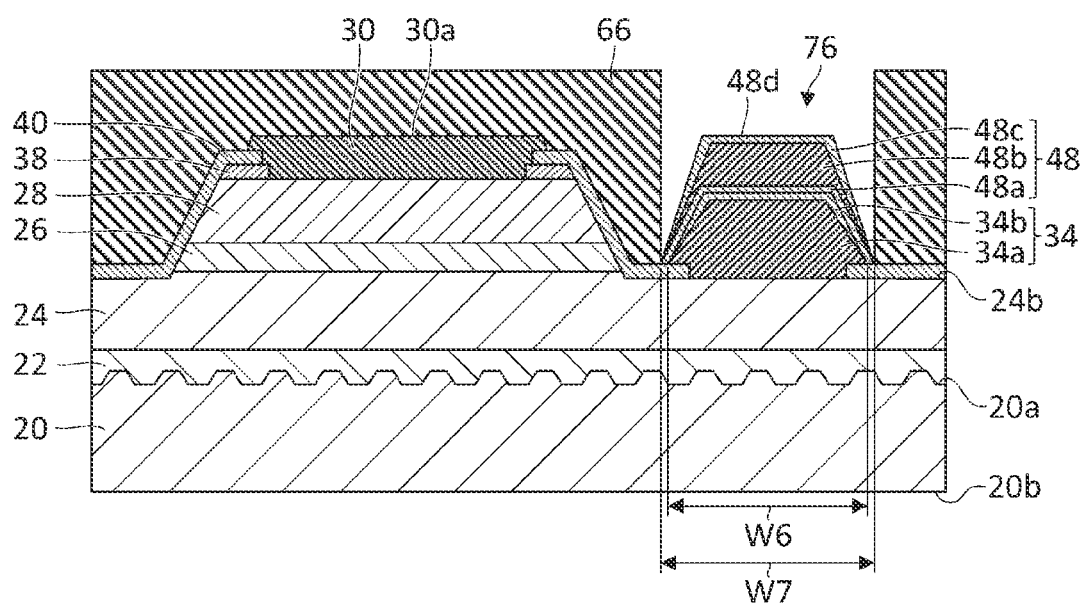
FIG. 9 is a drawing schematically illustrating a manufacturing process of the semiconductor light-emitting element.

Next, referring to FIG. 9, a sixth mask 66 is formed on the p-side contact electrode 30 and the second protective layer 40, and the first current diffusion layer 48 is formed in a sixth opening 76 where the sixth mask 66 is not provided. The sixth mask 66 may be formed by any of known lithographic technologies. The sixth opening 76 corresponds to the seventh region W7 where the first current diffusion layer 48 will be formed. The sixth opening 76 is wider than the sixth region W6 in which the n-side contact electrode 34 is formed. The first current diffusion layer 48 is formed on the annealed n-side contact electrode 34. In the sixth opening 76, the first TiN layer 48a is formed first, the metal layer 48b is formed on the first TiN layer 48a, and the second TiN layer 48c is formed on the metal layer 48b. The first TiN layer 48a, the metal layer 48b and the second TiN layer 48c may be formed by sputtering or EB evaporation. The height level of the upper surface 48d of the first current diffusion layer 48 corresponds to the height level of the upper surface 30a of the p-side contact electrode 30. The difference between the height level of the upper surface 30a of the p-side contact electrode 30 and the height level of the upper surface 48d of the first current diffusion layer 48 is 100 nm or smaller, or 50 nm or smaller. After forming the first current diffusion layer 48, the sixth mask 66 is removed.

Figure 10:
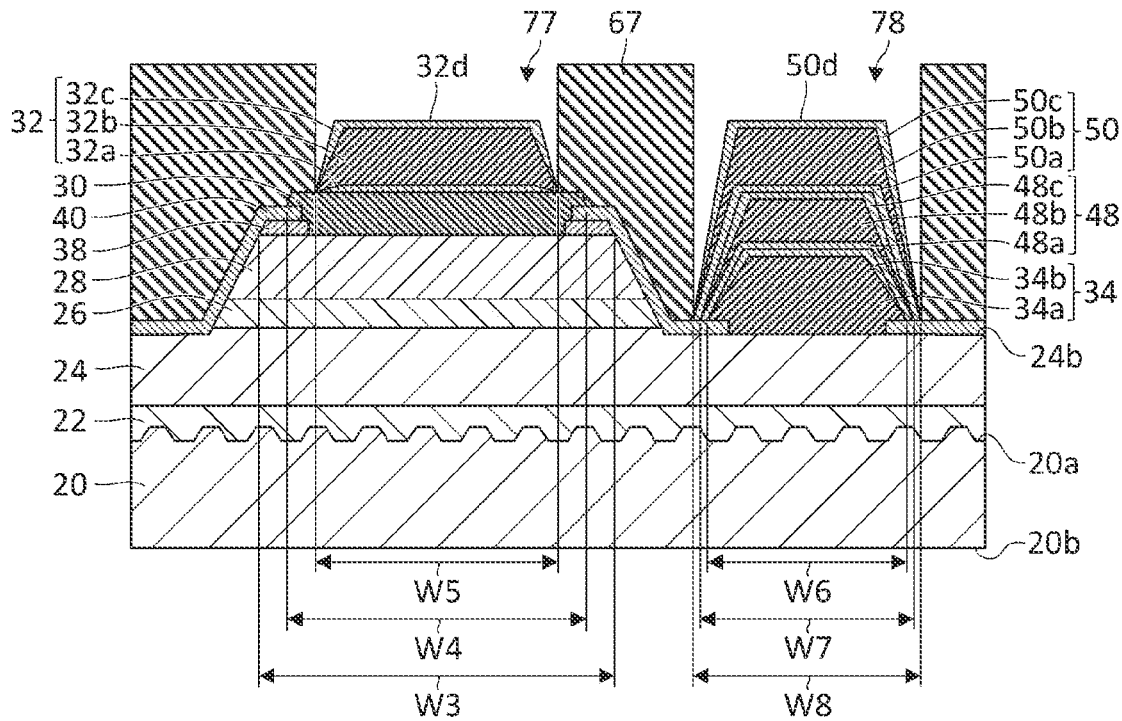
FIG. 10 is a drawing schematically illustrating a manufacturing process of the semiconductor light-emitting element.

Next, referring to FIG. 10, a seventh mask 67 is formed on the p-side contact electrode 30, the second protective layer 40 and the first current diffusion layer 48. The p-side current diffusion layer 32 is formed in a seventh opening 77 where the seventh mask 67 is not provided, and the second current diffusion layer 50 is formed in an eighth opening 78 where the seventh mask 67 is not provided. The seventh opening 77 corresponds to the fifth region W5 illustrated in FIG. 1. The opening region of the seventh opening 77 is smaller than the fourth region W4 in which the p-side contact electrode 30 is formed. The eighth opening 78 corresponds to the eighth region W8 illustrated in FIG. 1. The opening area of the eighth opening 78 is larger than the seventh region W7 in which the first current diffusion layer 48 is formed.

The p-side current diffusion layer 32 is formed on the p-side contact electrode 30 in the seventh opening 77. The second current diffusion layer 50 is formed on the first current diffusion layer 48 in the eighth opening 78. The p-side current diffusion layer 32 and the second current diffusion layer 50 can be formed at the same time. First, the first TiN layers 32a and 50a are formed, then the metal layers 32b and 50b are formed, and then the second TiN layers 32c and 50c are formed. The first TiN layers 32a, 50a, the metal layers 32b, 50b and the second TiN layers 32c, 50c may be formed by sputtering or EB evaporation. Simultaneous formation of the p-side current diffusion layer 32 and the second current diffusion layer 50 can equalize the thicknesses of the p-side current diffusion layer 32 and the second current diffusion layer 50, and can equalize the height levels of the upper surface 32d of the p-side current diffusion layer 32 and the upper surface 50d of the second current diffusion layer 50. After forming the p-side current diffusion layer 32 and the second current diffusion layer 50, the seventh mask 67 is removed.

The p-side current diffusion layer 32 and the second current diffusion layer 50 may also be formed independently, rather than simultaneously. For example, the p-side current diffusion layer 32 may be formed by using a mask through which the p-side current diffusion layer 32 is formed, and then the second current diffusion layer 50 may be formed by using a mask through which the second current diffusion layer 50 is formed. Order of formation of the p-side current diffusion layer 32 and the second current diffusion layer 50 is not particularly limited, allowing that the p-side current diffusion layer 32 may be formed, after forming the second current diffusion layer 50. For example, the first current diffusion layer 48 and the second current diffusion layer 50 may be formed in succession, and then the p-side current diffusion layer 32 may be formed.

Figure 11:
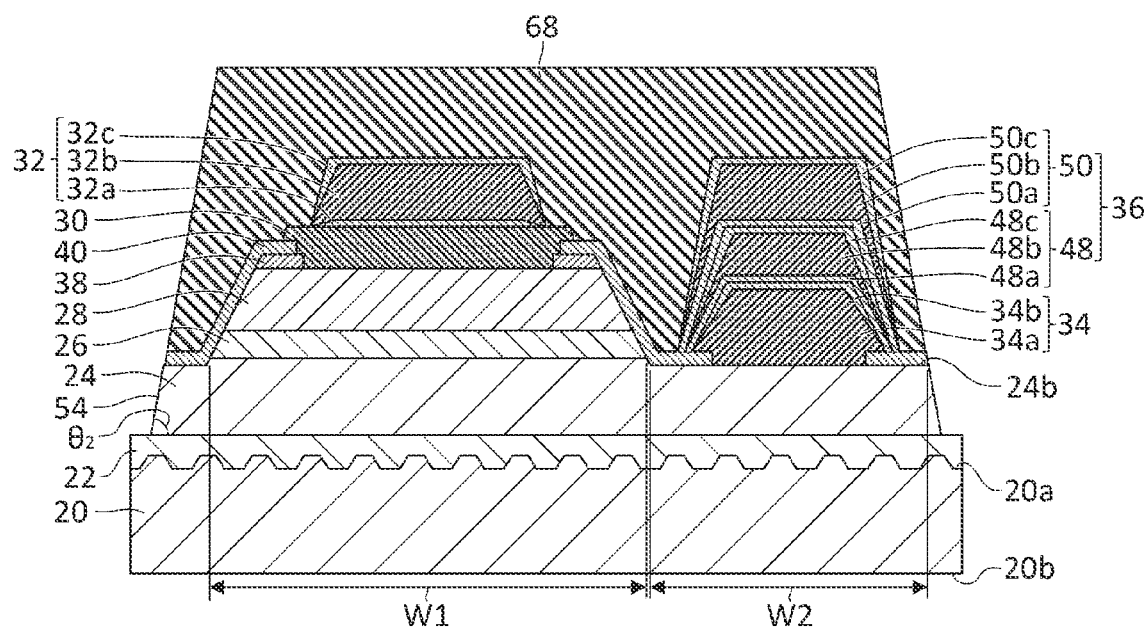
FIG. 11 is a drawing schematically illustrating a manufacturing process of the semiconductor light-emitting element.

Next, referring to FIG. 11, an eighth mask 68 is formed so as to cover the p-side contact electrode 30, the p-side current diffusion layer 32, the second protective layer 40, and the n-side current diffusion layer 36. The eighth mask 68 is provided over the first region W1 and the second region W2 illustrated in FIG. 1. The side face of the eighth mask 68 is inclined, wherein the angle of inclination of the side face of the eighth mask 68 is preset so that the second mesa face 54 that is inclined at the second angle $\theta_2$ may be formed. The eighth mask 68 may be formed by any of known lithographic technologies. Next, the second protective layer 40 and the n-type semiconductor layer 24 are etched through the eighth mask 68, so as to allow the base layer 22 to expose in a region thereof not overlapped with the eighth mask 68. As a result of this etching process, the second mesa face 54 inclined at the second angle $\theta_2$ is formed. The second protective layer 40 and the n-type semiconductor layer 24 may be dry-etched by using a chlorine-containing gas, or a mixed gas of a chlorine-containing gas and a rare gas. After forming the second mesa face 54, the eighth mask 68 is removed.

Figure 12:
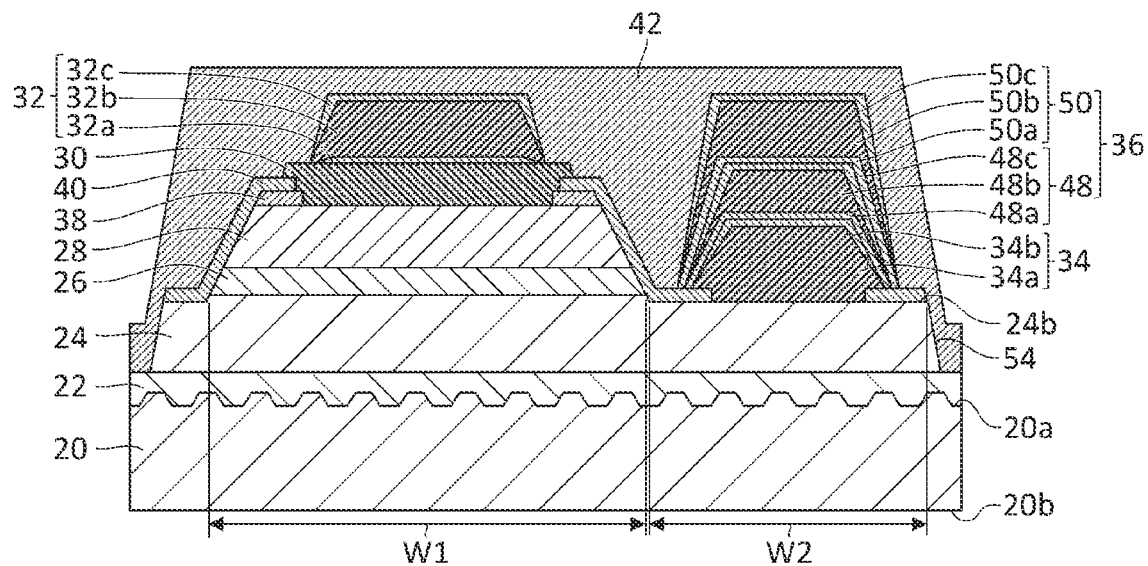
FIG. 12 is a drawing schematically illustrating a manufacturing process of the semiconductor light-emitting element.

Next, referring to FIG. 12, a third protective layer 42 is formed so as to cover the second side face (second mesa face 54) of the n-type semiconductor layer 24, the p-side contact electrode 30, the p-side current diffusion layer 32, the second protective layer 40, and the n-side current diffusion layer 36. The third protective layer 42 is formed over both of the first region W1 and the second region W2, so as to cover the entire upper surface of the device structure. The third protective layer 42 is typically made of $SiO_2$ or SiON, and may be formed by any of known technologies such as chemical vapor deposition (CVD).

Figure 13:
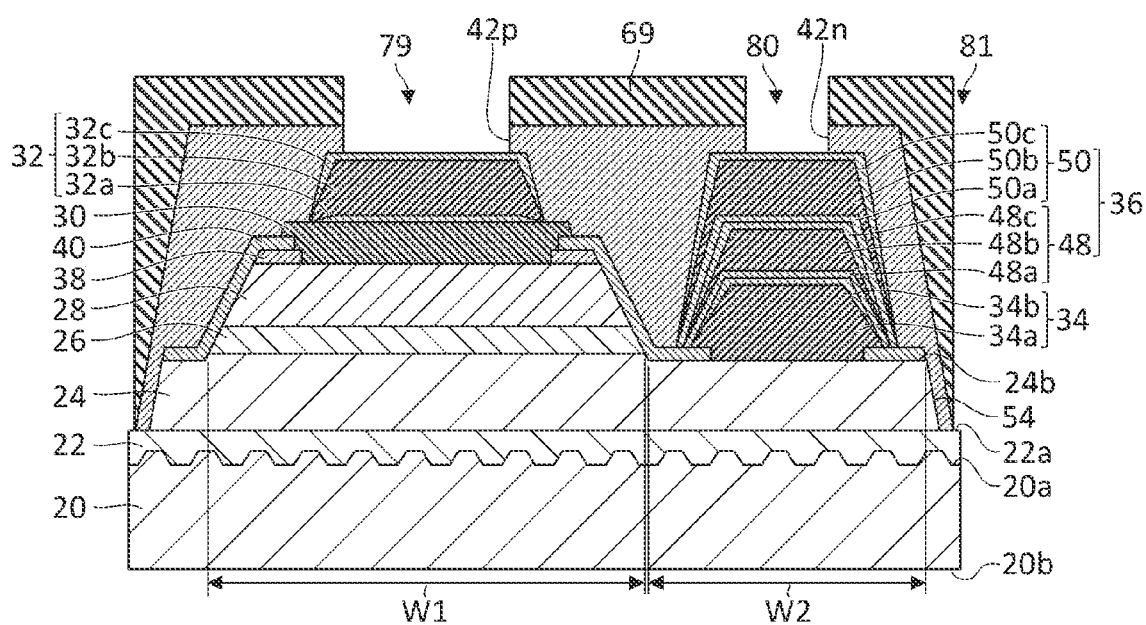
FIG. 13 is a drawing schematically illustrating a manufacturing process of the semiconductor light-emitting element.

Next, referring to FIG. 13, a ninth mask 69 is formed on the third protective layer 42, and the third protective layer 42 is removed in a ninth opening 79, in a tenth opening 80 and in an eleventh opening 81 where the ninth mask 69 is not provided. The third protective layer 42 may be dry-etched by using a CF-based etching gas, typically by using hexafluoroethane ($C_2F_6$). As a result of this etching process, a p-side pad opening 42p with the p-side current diffusion layer 32 exposed therein is formed in the ninth opening 79, and an n-side pad opening 42n with the n-side current diffusion layer 36 exposed therein is formed in the tenth opening 80. Moreover, in the eleventh opening 81, the base layer 22 is exposed. The eleventh opening 81 is located in an element splitting region along which a plurality of semiconductor light-emitting elements 10 are diced from a single substrate. After partially etching off the third protective layer 42, the ninth mask 69 is removed.

In the dry etching process illustrated in FIG. 13, the p-side current diffusion layer 32 and the n-side current diffusion layer 36 function as etching stop layers. More specifically, the second TiN layer 32c of the p-side current diffusion layer 32 and the second TiN layer 48c of the first current diffusion layer 48 function as the etching stop layers. TiN is less reactive with a fluorine-containing etching gas used for removing the third protective layer 42, and is less likely to yield by-products during the etching. The p-side contact electrode 30 and the n-side contact electrode 34 may therefore be prevented from being damaged. Moreover, the p-side current diffusion layer 32 and the n-side current diffusion layer 36 can keep high quality of their exposed surfaces, even after the dry etching.

Next, the p-side pad electrode 44 is formed on the p-side current diffusion layer 32 in the p-side pad opening 42p, and the n-side pad electrode 46 is formed on the n-side current diffusion layer 36 in the n-side pad opening 42n. The p-side pad electrode 44 and the n-side pad electrode 46 are typically formed by depositing a Ni layer or a Ti layer on the p-side current diffusion layer 32 and the n-side current diffusion layer 36, and then by depositing thereon an Au layer. Another metal layer may further be provided on the Au layer, for example, an Sn layer, an AuSn layer, or a stacked structure of Sn/Au may be formed.

The p-side pad electrode 44 and the n-side pad electrode 46 may be formed at the same time, or at different timings. For example, the p-side pad electrode 44 may be formed by using a mask through which the p-side pad electrode 44 is formed, and then the n-side pad electrode 46 may be formed by using the mask through which the n-side pad electrode 46 is formed. Order of formation of the p-side pad electrode 44 and the n-side pad electrode 46 is not particularly limited, allowing that the p-side pad electrode 44 may be formed, after forming the n-side pad electrode 46.

The semiconductor light-emitting element 10 illustrated in FIG. 1 is thus completed according to the aforementioned processes.

According to this embodiment, provision of the p-side current diffusion layer 32 can laterally (horizontally) diffuse the current injected through the p-side pad electrode 44, and can thereby expand the light emitting area of the active layer 26. This successfully enhances the light output of the semiconductor light-emitting element 10.

According to this embodiment, with the fifth region W5 in which the p-side current diffusion layer 32 is formed, made smaller than the fourth region W4 in which the p-side contact electrode 30 is formed, it now becomes possible to further increase the maximum area possibly occupied by the p-side contact electrode 30 on the upper surface 28a of the p-type semiconductor layer 28. If the fifth region W5 in which the p-side current diffusion layer 32 is formed were made wider than the fourth region W4 in which the p-side contact electrode 30 is formed, the fifth region W5 would become smaller than the third region W3 in which the upper surface 28a of the p-type semiconductor layer 28 is located, so that the fourth region W4 would become smaller than the fifth region W5, unfortunately reducing the maximum area possibly occupied by the fourth region W4. In contrast, this embodiment can expand as possible the area occupied by the p-side contact electrode 30 on the upper surface 28a of the p-type semiconductor layer 28, and can expand the light emitting area of the active layer 26. This successfully enhances the light output of the semiconductor light-emitting element 10.

According to this embodiment, with the eighth region W8 in which the n-side current diffusion layer 36 is formed, made larger than the sixth region W6 in which the n-side contact electrode 34 is formed, it now becomes possible to cover the entire n-side contact electrode 34 with the n-side current diffusion layer 36. Moreover, the n-side current diffusion layer 36, since being composed of the first current diffusion layer 48 and the second current diffusion layer 50, may have improved function of covering and sealing the n-side contact electrode 34. This makes it possible to prevent the Al layer, contained in the n-side contact electrode 34, from being corroded by oxidation or the like during energized use. The n-side contact electrode 34 can therefore be suppressed from decreasing the ultraviolet light reflectance, can keep on functioning as a reflective electrode over a long period, and can be suppressed from degrading the light output during energized use. That is, this makes it possible to embody the semiconductor light-emitting element 10 capable of maintaining high light output over a long period.

With the p-side current diffusion layer 32 and the n-side current diffusion layer 36, each having a stacked structure in which a TiN layer, a metal layer and a TiN layer are stacked in order, this embodiment can achieve high conductivity and can prevent metal migration. More specifically, for example, use of the TiN layer can prevent metal migration, and use of the metal layer between the TiN layers can increase the conductivity.

With the first current diffusion layer 48 provided thereto, this embodiment can equalize the height level of the upper surface 30a of the p-side contact electrode 30 and the height level of the upper surface 48d of the first current diffusion layer 48. In particular, since the thickness $t_0$ in this embodiment, measured from the second upper surface 24b of the n-type semiconductor layer 24 up to the upper surface 28a of the p-type semiconductor layer 28, is as large as about 400 nm to 1500 nm, so that absence of the first current diffusion layer 48 for height adjustment would cause large difference of height levels between the p-side pad electrode 44 and the n-side pad electrode 46. If there were such large difference of height levels between the p-side pad electrode 44 and the n-side pad electrode 46, when the semiconductor light-emitting element is bonded to a mounting substrate or the like, a non-uniform force may be applied thereto, possibly damaging the semiconductor light-emitting element. Defect rate of mounting tends to increase, particularly when the difference of height levels between the p-side pad electrode 44 and the n-side pad electrode 46 grows up to 200 nm or larger, or 500 nm or larger. In contrast, with the difference between the height level of the upper surface 30a of the p-side contact electrode 30 and the height level of the upper surface 48d of the first current diffusion layer 48 controlled to 100 nm or smaller, this embodiment can reduce the difference of height levels between the p-side pad electrode 44 and the n-side pad electrode 46 down to 100 nm or below, making it possible to reduce the defect rate in mounting.

With the structure and thickness of the p-side current diffusion layer 32 and the second current diffusion layer 50 substantially commonized, this embodiment can equalize the force possibly applied to the p-side contact electrode 30 and the first current diffusion layer 48 when mounting the semiconductor light-emitting element 10, successfully reducing the defect rate at the time of mounting.

According to this embodiment, the p-side current diffusion layer 32 and the n-side current diffusion layer 36, having the TiN layers used therein, can improve adhesiveness to the third protective layer 42 made of a dielectric material. This successfully prevents the sealing function from degrading, possibly caused by separation of the third protective layer 42 from the p-side contact electrode 30 and the n-side contact electrode 34. This enables to embody the semiconductor light-emitting element 10 whose light output will be less likely to decline over a long period.

With the metal layer 34a of the n-side contact electrode 34, annealed while being provided thereon with the TiN layer 34b, this embodiment can prevent the metal layer 34a from being oxidized in annealing. This successfully prevents the n-side contact electrode 34 from degrading the ultraviolet reflectivity, and prevents the n-side contact electrode 34 from degrading the planarity of the upper surface thereof.

With the first current diffusion layer 48 and the second current diffusion layer 50 formed after annealing the n-side contact electrode 34, this embodiment can prevent the first current diffusion layer 48 and the second current diffusion layer 50 from being degraded by annealing. Similarly, with the p-side current diffusion layer 32 formed after annealing the p-side contact electrode 30, this embodiment can also prevent the p-side current diffusion layer 32 from being degraded by annealing.

Second Embodiment

Figure 14:
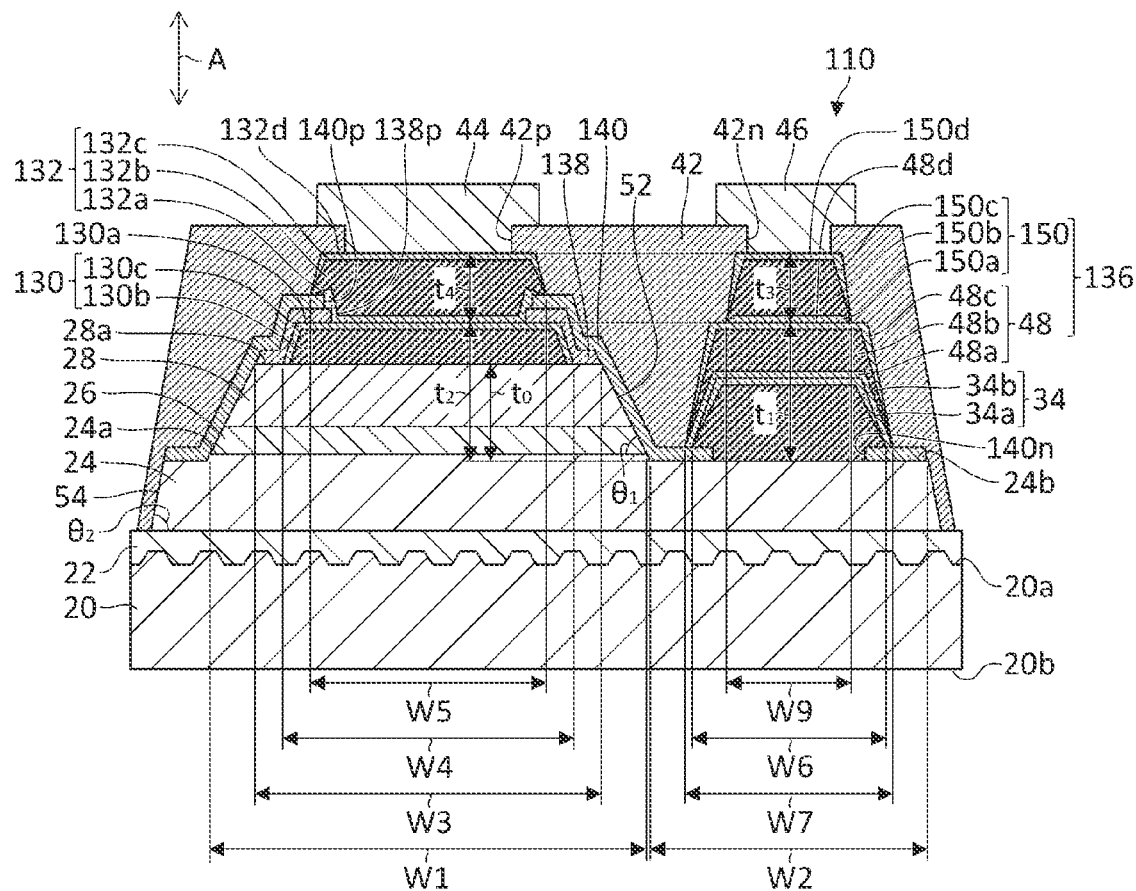
FIG. 14 is a cross-sectional view schematically illustrating a structure of a semiconductor light-emitting element according to a second embodiment.

FIG. 14 is a cross-sectional view schematically illustrating a structure of a semiconductor light-emitting element 110 according to a second embodiment. The semiconductor light-emitting element 110 illustrated in FIG. 14 differs from the above-described embodiment, in structures of a p-side contact electrode 130, a p-side current diffusion layer 132, an n-side current diffusion layer 136, a first protective layer 138, and a second protective layer 140. This embodiment will be explained below, focusing on differences from the aforementioned first embodiment, without duplicating the explanation as appropriate.

The semiconductor light-emitting element 110 has the substrate 20, the base layer 22, the n-type semiconductor layer 24, the active layer 26, the p-type semiconductor layer 28, a p-side contact electrode 130, a p-side current diffusion layer 132, the n-side contact electrode 34, an n-side current diffusion layer 136, a first protective layer 138, a second protective layer 140, the third protective layer 42, the p-side pad electrode 44, and the n-side pad electrode 46.

The p-side contact electrode 130 is provided on the upper surface 28a of the p-type semiconductor layer 28, and is provided between the p-type semiconductor layer 28 and the first protective layer 138. The p-side contact electrode 130 is different from the p-side contact electrode 30 of the above-described embodiment, in that it is provided under the first protective layer 138. The p-side contact electrode 130 has a metal layer 130b and a TiN layer 130c. The metal layer 130b is composed of a platinum group metal such as Rh, or a stacked structure of Ni/Au. The TiN layer 130c is composed of conductive TiN, and is provided so as to cover the upper surface and the side face of the metal layer 130b. The height level of the upper surface 130a of the p-side contact electrode 130 is aligned with the height level of the upper surface 48d of the first current diffusion layer 48. Difference between the height level of the upper surface 130a of the p-side contact electrode 130 and the height level of the upper surface 48d of the first current diffusion layer 48 is 100 nm or smaller, preferably 50 nm or smaller.

The p-side current diffusion layer 132 is provided on the upper surface 130a of the p-side contact electrode 130. The p-side current diffusion layer 132 is provided so as to close a first p-side contact opening 138p provided in the first protective layer 138, and an n-side contact opening 140n provided in the second protective layer 140. The p-side current diffusion layer 132 is provided so as to overlap the first protective layer 138 and the second protective layer 140. The p-side current diffusion layer 132 has a structure in which a first TiN layer 132a, a metal layer 132b, and a second TiN layer 132c are stacked in order.

The n-side current diffusion layer 136 is provided over a seventh region W7, which is larger than the sixth region W6 in which the n-side contact electrode 34 is formed. The n-side current diffusion layer 136 has the first current diffusion layer 48 and a second current diffusion layer 150. The first current diffusion layer 48 is structured in the same manner as in the above-described embodiment. The second current diffusion layer 150 is provided in the ninth region W9, which is narrower than the seventh region W7 in which the first current diffusion layer 48 is formed, unlike in the above-described embodiment. In a plan view of the semiconductor light-emitting element 110 when seen through in the thickness direction, the entire ninth region W9 falls inside the seventh region W7. In the illustrated example, the ninth region W9 in which the second current diffusion layer 150 is provided is narrower than the sixth region W6 in which the n-side contact electrode 34 is provided. Note that the ninth region W9 in which the second current diffusion layer 150 is provided may coincide with the sixth region W6, or may be wider than the sixth region W6.

The second current diffusion layer 150 has a structure in which a first TiN layer 150a, a metal layer 150b and a second TiN layer 150c are stacked in order. The second current diffusion layer 150 is structured similarly to the p-side current diffusion layer 132, so that the thickness $t_3$ of the second current diffusion layer 150 and thickness $t_4$ of the p-side current diffusion layer 132 will be equal. The height level of the upper surface 150d of the second current diffusion layer 150 therefore substantially coincides with the height level of the upper surface 132d of the p-side current diffusion layer 132. Specifically, the difference between the height level of the upper surface 150d of the second current diffusion layer 150 and the height level of the upper surface 132d of the p-side current diffusion layer 132 is adjusted to 100 nm or smaller, preferably 50 nm or smaller.

Figure 15:
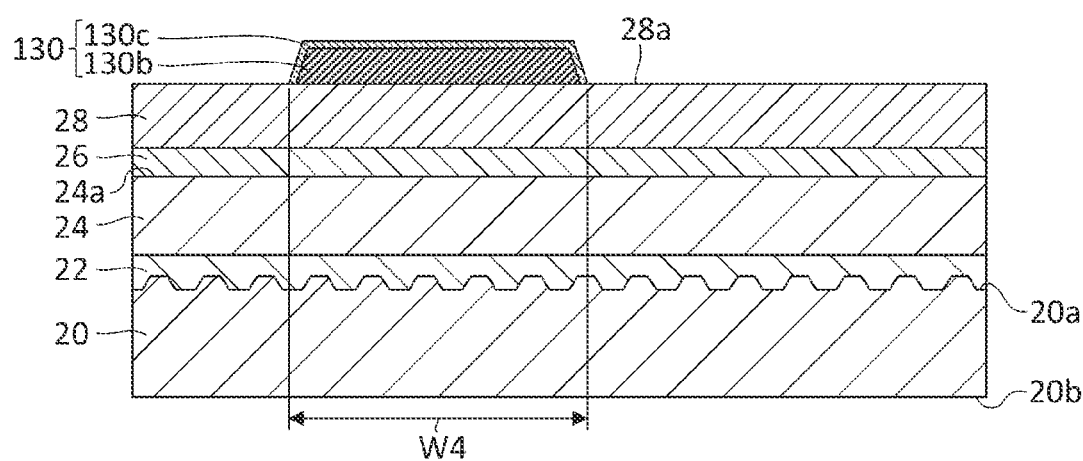
FIG. 15 is a drawing schematically illustrating a manufacturing process of the semiconductor light-emitting element.

Next, a method of manufacturing the semiconductor light-emitting element 110 will be explained below. FIG. 15 and subsequent drawings schematically illustrate processes of manufacturing the semiconductor light-emitting element 110. Referring to FIG. 15, first the base layer 22, the n-type semiconductor layer 24, the active layer 26 and the p-type semiconductor layer 28 are formed on the first principal surface 20a of the substrate 20. These layers may be formed in the same way as explained previously referring to FIG. 2.

Next, the p-side contact electrode 130 is formed on the upper surface 28a of the p-type semiconductor layer 28. The p-side contact electrode 130 is formed in the fourth region W4 illustrated in FIG. 14. First, a mask is formed on the upper surface 28a of the p-type semiconductor layer 28 excluding the fourth region W4. Next, the metal layer 130b is formed in the fourth region W4, and the TiN layer 130c is formed on the metal layer 130b. The p-side contact electrode 130 may be formed by sputtering or EB evaporation. The p-side contact electrode 130 is thus formed. After the p-side contact electrode 130 is formed, the mask may be removed and then the p-side contact electrode 130 may be annealed.

Figure 16:
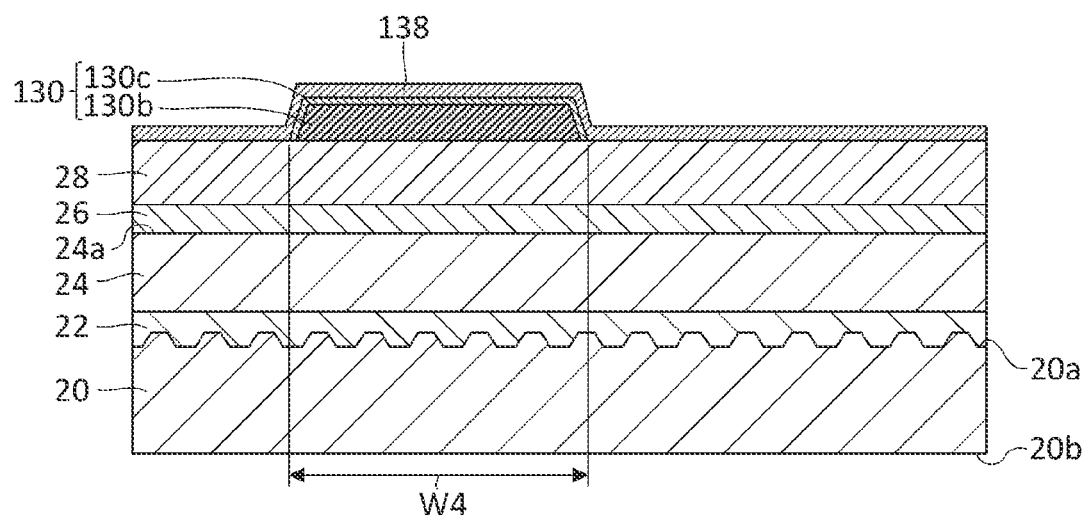
FIG. 16 is a drawing schematically illustrating a manufacturing process of the semiconductor light-emitting element.

Next, referring to FIG. 16, the first protective layer 138 is formed on the p-type semiconductor layer 28 and the p-side contact electrode 130. The first protective layer 138 is made of $SiO_2$ or SiON, and may be formed by any of known technologies such as chemical vapor deposition (CVD).

Figure 17:
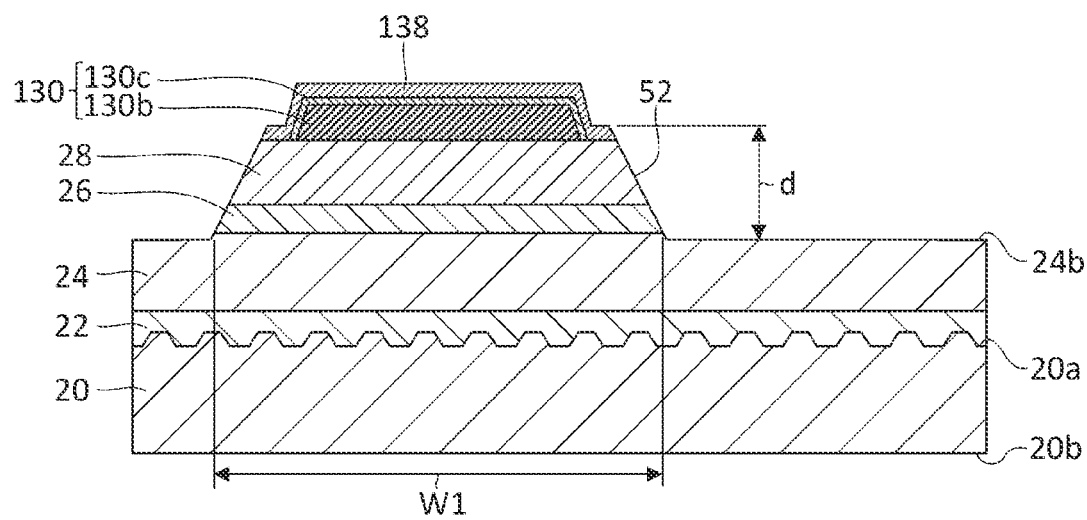
FIG. 17 schematically shows a process of manufacturing the semiconductor light-emitting element.

Next, referring to FIG. 17, the first mesa face 52 is formed. The first mesa face 52 may be formed in the same way as in the process illustrated in FIG. 3.

Figure 18:
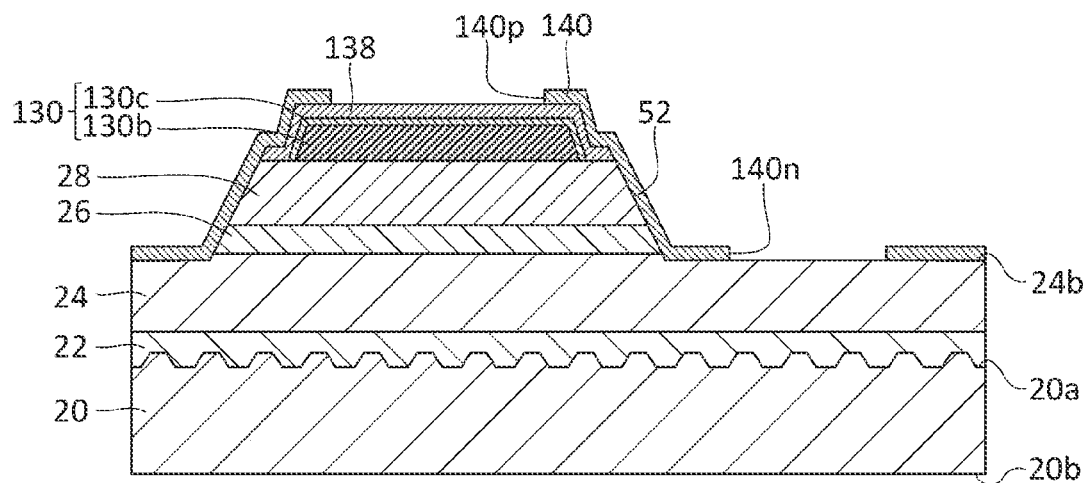
FIG. 18 schematically shows a process of manufacturing the semiconductor light-emitting element.

Next, referring to FIG. 18, the second protective layer 140 is formed so as to cover the second upper surface 24b of the n-type semiconductor layer 24 and the first protective layer 138. The second protective layer 140 may be formed in the same way as in the process illustrated in FIG. 4. Next, the second protective layer 140 is partially removed to form a second p-side contact opening 140p and an n-side contact opening 140n. The second p-side contact opening 140p and the n-side contact opening 140n may be formed in the same way as in the process illustrated in FIG. 5.

Figure 19:
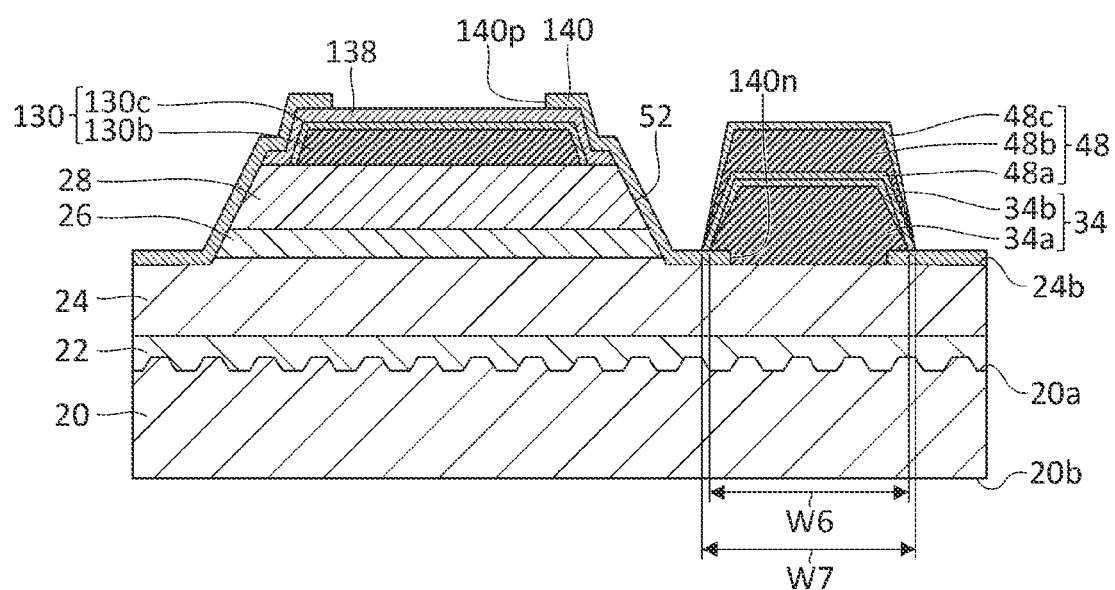
FIG. 19 is a drawing schematically illustrating a manufacturing process of the semiconductor light-emitting element.

Next, referring to FIG. 19, the n-side contact electrode 34 is formed in the n-side contact opening 140n, and the first current diffusion layer 48 is formed on the n-side contact electrode 34. The n-side contact electrode 34 may be formed in the same way as in the process illustrated in FIG. 6. The first current diffusion layer 48 may be formed in the same way as in the process illustrated in FIG. 9.

Figure 20:
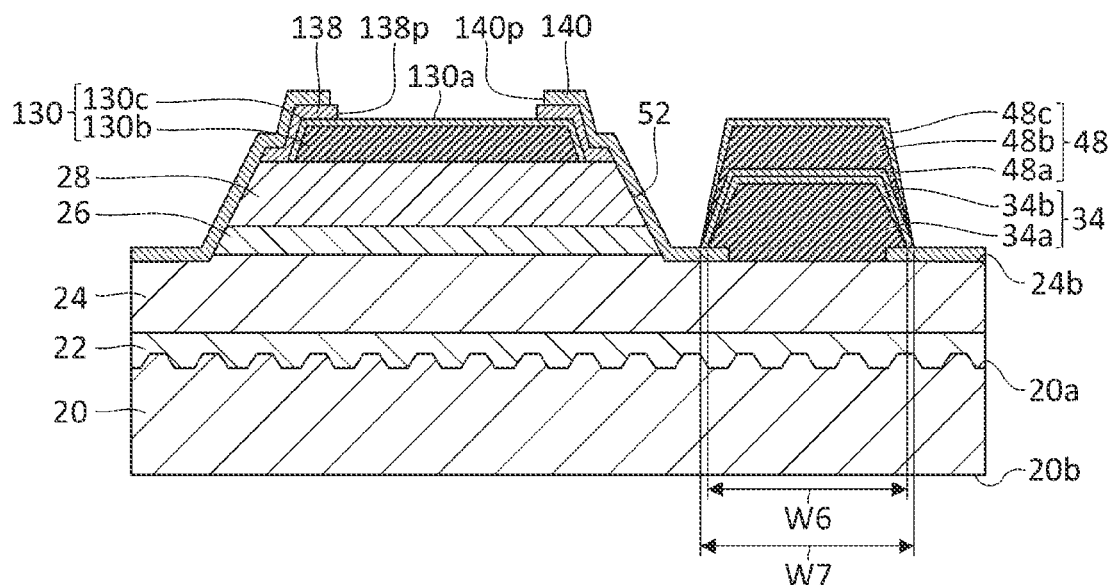
FIG. 20 is a drawing schematically illustrating a manufacturing process of the semiconductor light-emitting element.

Next, referring to FIG. 20, a first p-side contact opening 138p is formed in the first protective layer 138, to expose therein the upper surface 130a of the p-side contact electrode 130. The first p-side contact opening 138p may be formed in the same way as in the process illustrated in FIG. 7.

Figure 21:
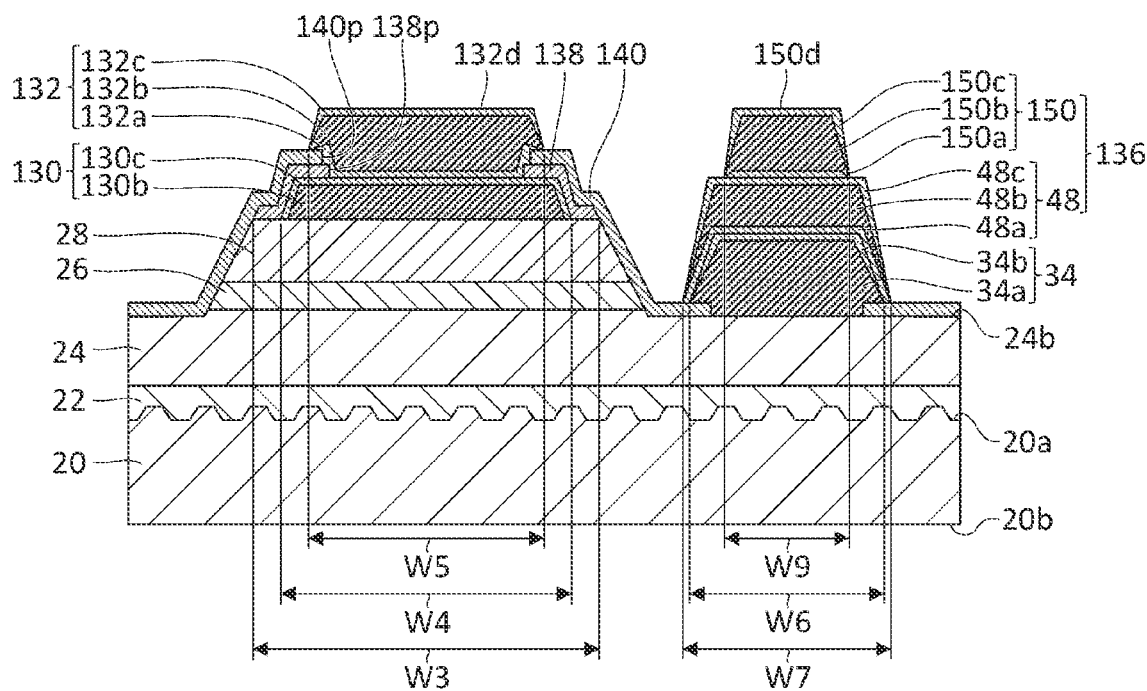
FIG. 21 is a drawing schematically illustrating a manufacturing process of the semiconductor light-emitting element.

Next, referring to FIG. 21, the p-side current diffusion layer 132 is formed on the p-side contact electrode 130, and the second current diffusion layer 150 is formed on the first current diffusion layer 48. The fifth region W5 in which the p-side current diffusion layer 132 is formed is narrower than the fourth region W4 in which the p-side contact electrode 130 is formed. Moreover, the ninth region W9 in which the second current diffusion layer 150 is formed is narrower than the seventh region W7 in which the first current diffusion layer 48 is formed. The p-side current diffusion layer 132 and the second current diffusion layer 150 may be formed at the same time, in the same way and in the process illustrated in FIG. 10.

Next, in the same way as the processes illustrated in FIGS. 11 to 13, the second mesa face 54 is formed, the third protective layer 42 is formed, the n-side pad opening 42n and the p-side pad opening 42p are formed in the third protective layer 42, and the p-side pad electrode 44 and the n-side pad electrode 46 are formed. The semiconductor light-emitting element 110 illustrated in FIG. 14 is thus completed according to the aforementioned processes.

Also the semiconductor light-emitting element 110 according to this embodiment can demonstrate effects same as those in the aforementioned embodiment. Moreover, according to this embodiment, the p-side contact electrode 130 having the TiN layer 130c used therein can improve adhesiveness between the p-side contact electrode 130 and the first protective layer 138.

The present invention has been explained referring to the embodiments. Those skilled in the art will understand that the present invention is not limited to the aforementioned embodiments, instead allowing various design changes and various modified examples, and that also such modifications are within the scope of the present invention.

In another embodiment, the structures of the semiconductor light-emitting elements 10, 110 in the aforementioned embodiments are properly interchangeable. For example, the semiconductor light-emitting element 10 illustrated in FIG. 1 may have the n-side current diffusion layer 136 illustrated in FIG. 14, in place of the n-side current diffusion layer 36 illustrated in FIG. 1. Similarly, the semiconductor light-emitting element 110 illustrated in FIG. 14 may have the n-side current diffusion layer 36 illustrated in FIG. 1 in place of the n-side current diffusion layer 136 illustrated in FIG. 14.

In one embodiment, at least either the first current diffusion layer 48 or the second current diffusion layer 50, 150 is provided over a region wider than the sixth region W6 in which the n-side contact electrode 34 is formed. For example as illustrated in FIG. 14, the first current diffusion layer 48 is provided over a region wider than the sixth region W6, whereas the second current diffusion layer 50, 150 is provided over a region that coincides with, or narrower than the sixth region W6. Alternatively, the first current diffusion layer 48 may be provided in a region corresponded to, or narrower than the sixth region W6, meanwhile the second current diffusion layer 50, 150 may be provided in a region wider than the sixth region W6. Again alternatively as illustrated in FIG. 1, both of the first current diffusion layer 48 and the second current diffusion layer 50, 150 may be provided in a region wider than the sixth region W6. In these cases, the seventh region W7 in which the first current diffusion layer 48 is formed may coincide with the eighth region W8 or the ninth region W9 in which the second current diffusion layer 50, 150 is formed, may be narrower than the eighth region W8 or the ninth region W9, or may be wider than the eighth region W8 or the ninth region W9.

The aforementioned embodiments have described the cases where the n-side current diffusion layer 36, 136 includes the first current diffusion layer 48 and the second current diffusion layer 50, 150. In another embodiment, the n-side current diffusion layer 36, 136 may be comprised of a single current diffusion layer. That is, the n-side current diffusion layer 36, 136 may include only one stacked structure of the first TiN layer, the metal layer and the second TiN layer. The n-side current diffusion layer 36, 136 may have three or more stacked structures each comprised of the first TiN layer, the metal layer and the second TiN layer. Alternatively, the p-side current diffusion layer 32, 132 may include two or more stacked structures each composed of the first TiN layer, the metal layer and the second TiN layer.

What is claimed is:

1. A semiconductor light-emitting element comprising:
    an n-type semiconductor layer composed of an n-type AlGaN-based semiconductor material;
    an active layer provided on a first upper surface of the n-type semiconductor layer and composed of an AlGaN-based semiconductor material;
    a p-type semiconductor layer provided on the active layer;
    a p-side contact electrode provided in contact with the upper surface of the p-type semiconductor layer;
    a p-side current diffusion layer provided on the p-side contact electrode in a region narrower than a formation region of the p-side contact electrode, wherein the p-side current diffusion layer has a stacked structure in which a TiN layer, a metal layer, and a TiN layer are stacked in order;
    a p-side pad electrode provided on the p-side current diffusion layer;
    an n-side contact electrode provided in contact with a second upper surface of the n-type semiconductor layer;
    an n-side current diffusion layer provided on the n-side contact electrode over a region wider than a formation region of the n-side contact electrode, wherein the n-side current diffusion layer includes a first current diffusion layer provided on the n-side contact electrode and a second current diffusion layer provided on the first current diffusion layer, and wherein each of the first current diffusion layer and the second current diffusion layer has a stacked structure in which a TiN layer, a metal layer and a TiN layer are stacked in order; and
    an n-side pad electrode provided on the n-side current diffusion layer,
    wherein a number of the stacked structure included in the n-side current diffusion layer is larger than a number of the stacked structure included in the p-side current diffusion layer.

2. The semiconductor light-emitting element according to claim 1, wherein the first current diffusion layer is provided over a region wider than the formation region of the n-side contact electrode.

3. The semiconductor light-emitting element according to claim 1, wherein the second current diffusion layer is provided over a region wider than a formation region of the first current diffusion layer.

4. The semiconductor light-emitting element according to claim 1, wherein the metal layer in the stacked structure is thicker than the TiN layer in the stacked structure.

5. The semiconductor light-emitting element according to claim according to claim 1, wherein the p-side current diffusion layer includes a single stacked structure and the n-side current diffusion layer includes double stacked structures corresponding to the first and second current diffusion layers.

* * * * *